United States Patent
Ishii et al.

(10) Patent No.: US 10,707,212 B1
(45) Date of Patent: Jul. 7, 2020

(54) METHODS OF FORMING AN APPARATUS, AND RELATED APPARATUSES AND ELECTRONIC SYSTEMS

(71) Applicant: Micron Technology, Inc., Boise, ID (US)

(72) Inventors: Kentaro Ishii, Tokyo (JP); Yongjun J. Hu, Boise, ID (US); Amirhasan Nourbakhsh, Boise, ID (US); Durai Vishak Nirmal Ramaswamy, Boise, ID (US); Christopher W. Petz, Boise, ID (US); Luca Fumagalli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/235,957

(22) Filed: Dec. 28, 2018

(51) Int. Cl.
*H01L 27/108* (2006.01)

(52) U.S. Cl.
CPC .. *H01L 27/10847* (2013.01); *H01L 27/10805* (2013.01)

(58) Field of Classification Search
CPC .............. H01L 27/10847; H01L 27/10805
USPC ........................................................ 257/296
See application file for complete search history.

(56) References Cited

U.S. PATENT DOCUMENTS

| 2013/0285206 A1* | 10/2013 | Yang | G11C 11/404 |
| | | | 257/532 |
| 2018/0151497 A1* | 5/2018 | Makala | H01L 23/535 |

\* cited by examiner

*Primary Examiner* — Tu-Tu V Ho
(74) *Attorney, Agent, or Firm* — TraskBritt

(57) ABSTRACT

A method of forming an apparatus comprises forming a first metal nitride material over an upper surface of a conductive material within an opening extending through at least one dielectric material through a non-conformal deposition process. A second metal nitride material is formed over an upper surface of the first metal nitride material and side surfaces of the at least one dielectric material partially defining boundaries of the opening through a conformal deposition process. A conductive structure is formed over surfaces of the second metal nitride material within the opening. Apparatuses and electronic systems are also described.

23 Claims, 10 Drawing Sheets

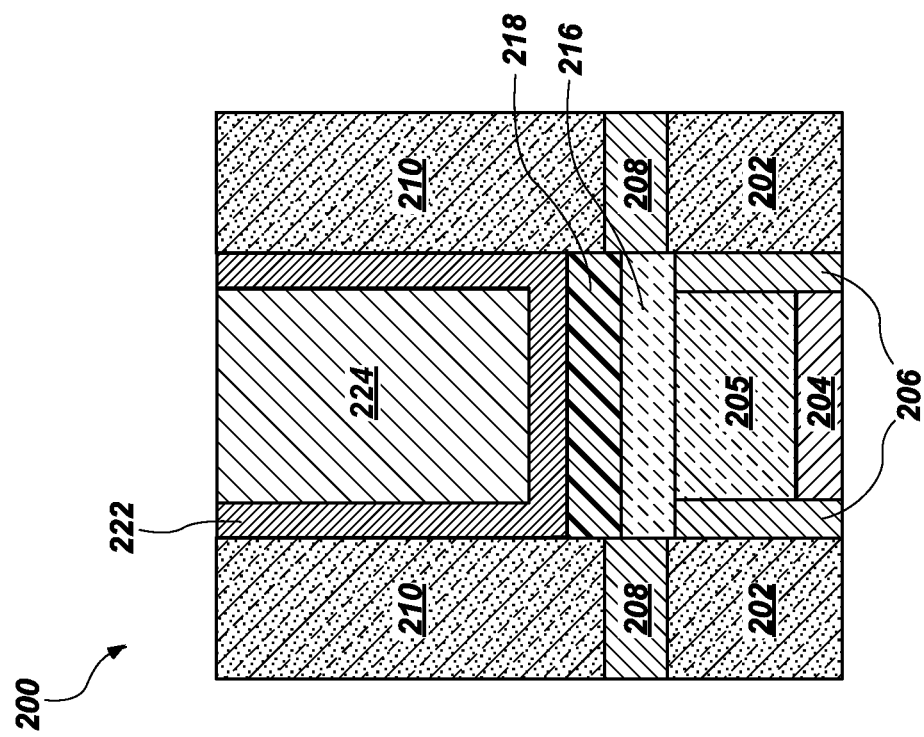
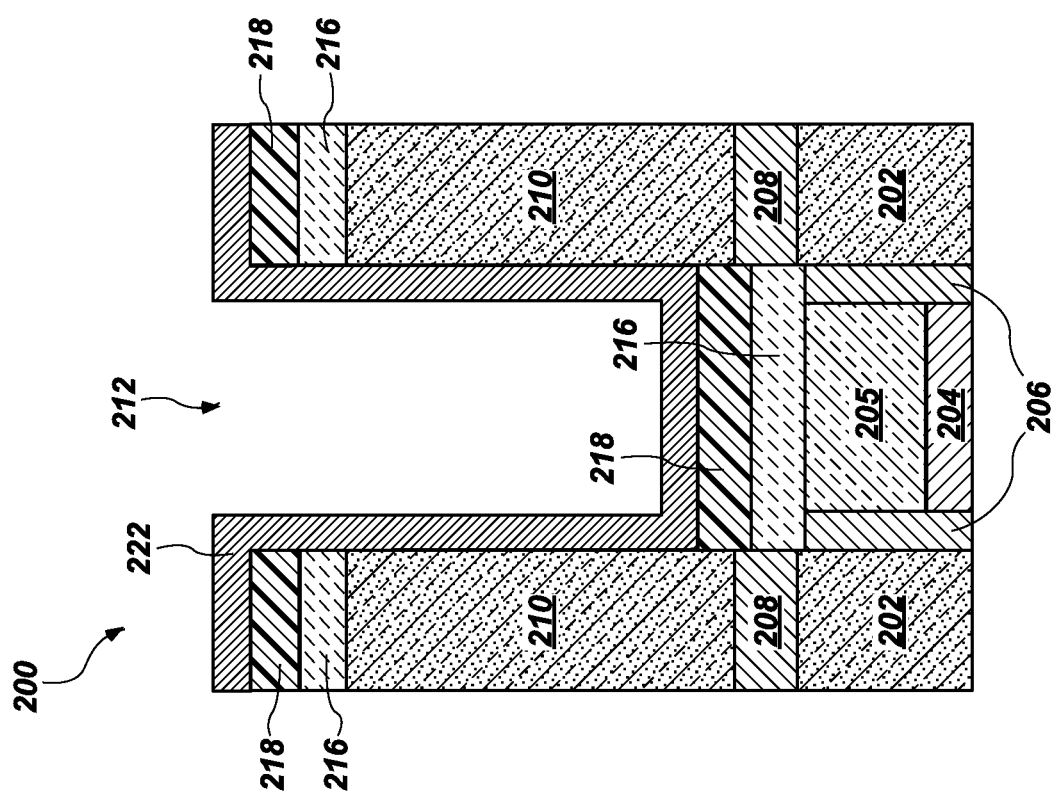
FIG. 2D
FIG. 2C

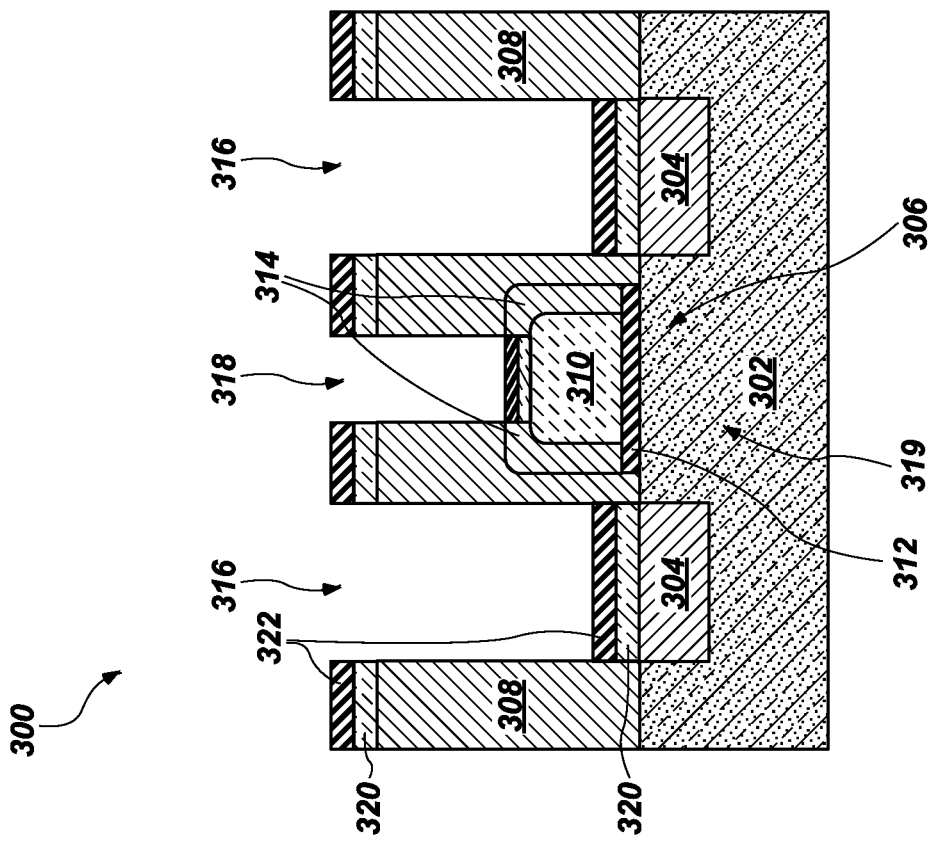
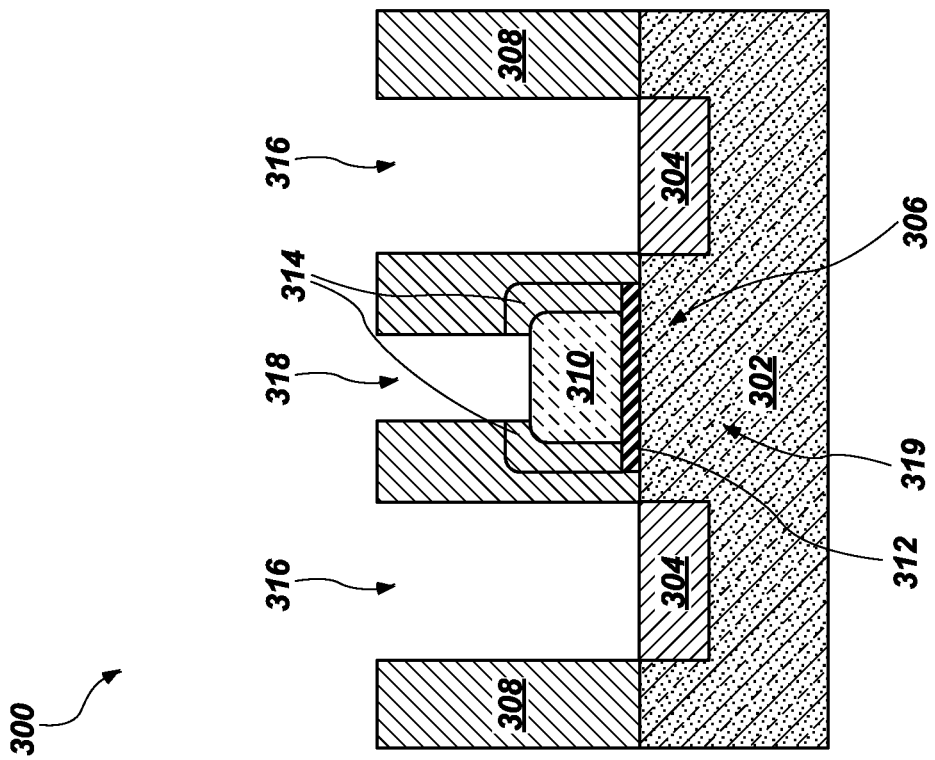
FIG. 3B
FIG. 3A

US 10,707,212 B1

METHODS OF FORMING AN APPARATUS, AND RELATED APPARATUSES AND ELECTRONIC SYSTEMS

TECHNICAL FIELD

Embodiments of the disclosure relate to the field of semiconductor device design and fabrication. More specifically, embodiments of the disclosure relate to methods of forming an apparatus, and to related apparatuses, semiconductor devices, and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often seek to design architectures that are not only compact, but offer performance advantages, as well as simplified designs One example of a semiconductor device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), FLASH memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes an access device (e.g. a transistor) and a memory storage structure (e.g., a capacitor) electrically coupled to the access device through a conductive contact. The access device generally includes a channel region between a pair of source/drain regions, and a gate electrode configured to electrically connect the source/drain regions to one another through the channel region. The access device generally includes a channel region between a pair of source/drain regions, and a gate configured to electrically connect the source/drain regions to one another through the channel region. The access devices can comprise planar access devices or vertical access devices. Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base structure thereunder, and current flow between source and drain regions of a planar access device is primarily parallel to the primary surface of the substrate or base thereunder.

Unfortunately, conventional methods of forming memory cells for memory devices can negatively impact desirable electrical properties of the memory cells and the memory devices. For example, a conductive contact included in a conventional memory cell may employ cobalt disilicide ($CoSi_2$) to decrease contact resistance, as well as a metal nitride (e.g., TiN) liner to facilitate adhesion of a conductive structure (e.g., a conductive plug) to the $CoSi_2$. However, it can be difficult to form $CoSi_2$ to substantially uniform thickness at relatively small contact diameters (e.g., diameters less than or equal to about 100 Angstroms (Å)), resulting in $CoSi_2$ detachment problems (e.g., due to void creation in the $CoSi_2$) and/or undesirable leakage currents (e.g., due to undesirable metal silicide growth into a silicon-containing region of the memory cell, such as a source/drain region of an access device thereof). $CoSi_2$ oxidation can also undesirably increase contact resistance, requiring complex cleaning strategies (especially at relatively small contact diameters). Furthermore, conventional methods of forming the metal nitride liner can result in undesirable migration (e.g., diffusion) of metal of the metal nitride liner and/or other materials (e.g., atoms of precursor compounds used to form the metal nitride liner through chemical vapor deposition (CVD) processes) into other portions of the memory cell (e.g., a silicon-containing region of the memory cell, such as a source/drain region of an access device thereof) that can also effectuate undesirable leakage currents. Conventional methods of forming the metal nitride liner can also undesirability limit the size of the conductive structure subsequently formed thereover, which may undesirably increase contact resistance and/or may require complex alignment processes to connect other structures to the conductive structure.

A need, therefore, exists for new, simple, and cost-efficient methods of forming apparatuses that alleviate one or more of the aforementioned problems, as well as new apparatuses, semiconductor devices (e.g., memory devices, such as DRAM devices), and electronic systems.

BRIEF DESCRIPTION OF THE SEVERAL VIEWS OF THE DRAWINGS

FIGS. 2A through 2D are simplified, partial cross-sectional views illustrating a method of forming an apparatus, in accordance with additional embodiments of the disclosure.

FIGS. 3A through 3D are simplified, partial cross-sectional views illustrating a method of forming an apparatus, in accordance with further embodiments of the disclosure.

DETAILED DESCRIPTION

Figure 1B:
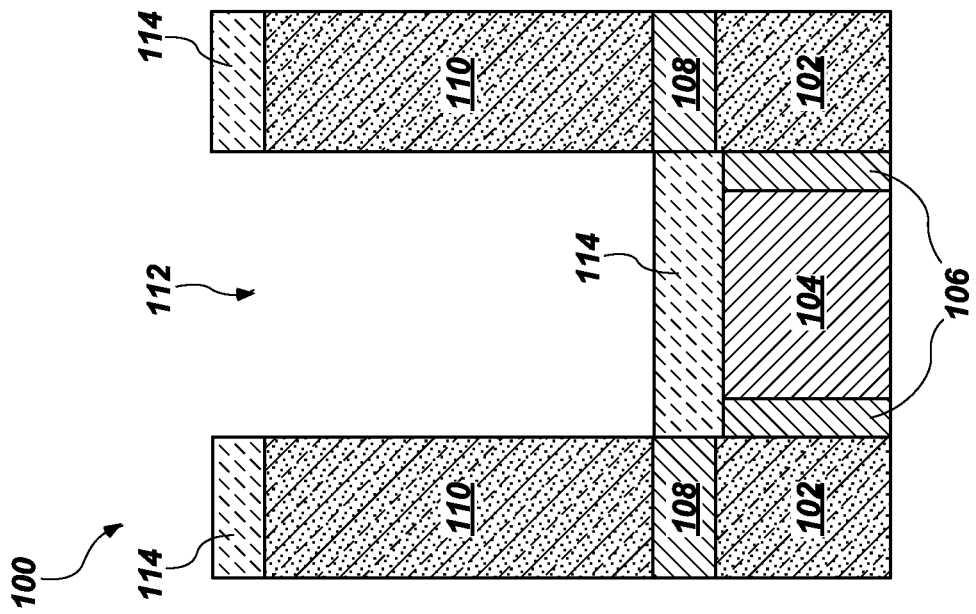
FIGS. 1A through 1G are simplified, partial cross-sectional views illustrating a method of forming an apparatus, in accordance with embodiments of the disclosure.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flows for manufacturing an apparatus, semiconductor device, or electronic system. The structures described below do not form a complete apparatus, semiconductor device, or electronic system. Only those process acts and structures necessary to understand the embodiments of the disclosure are described in detail below. Additional acts to form a complete apparatus, semiconductor device, or electronic system from the structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a base structure (e.g., base material, base construction) in, on, or over which one or more structures and/or features are formed and are not necessarily defined by earth's gravitational field. A "lateral" or "horizontal" direction is a direction that is substantially parallel to the major plane of the base structure, while a "longitudinal" or "vertical" direction is a direction that is substantially perpendicular to the major plane of the base structure. The major plane of the base structure is defined by a surface of the base structure having a relatively large area compared to other surfaces of the base structure.

As used herein, reference to a feature as being "over" an additional feature means and includes the feature being directly on top of, adjacent to (e.g., horizontally adjacent to, vertically adjacent to), underneath, or in direct contact with the additional feature. It also includes the element being indirectly on top of, adjacent to (e.g., horizontally adjacent to, vertically adjacent to), underneath, or near the additional feature, with one or more other features located therebetween. In contrast, when an element is referred to as being "on" or another element, there are no intervening features therebetween.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD (PECVD)), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 1G are simplified partial cross-sectional views illustrating embodiments of a method of forming an apparatus (e.g., a semiconductor device, such as a DRAM device). With the description provided below, it will be readily apparent to one of ordinary skill in the art that the methods described herein may be used in fabrication of various devices. In other words, the methods of the disclosure may be used whenever it is desired to form an apparatus.

Figure 1A:
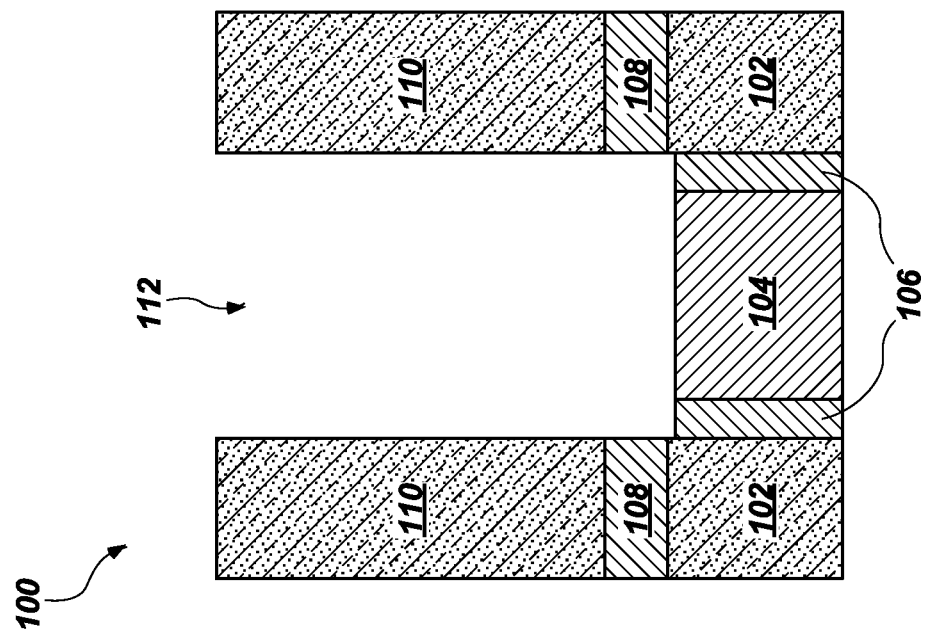

Referring to FIG. 1A, an apparatus 100 may include a first dielectric structure 102, a contact structure 104 vertically extending through the first dielectric structure 102, a dielectric liner 106 horizontally extending from and between the contact structure 104 and the first dielectric structure 102, a second dielectric structure 108 vertically overlying at least the first dielectric structure 102, a third dielectric structure 110 vertically overlying at least the second dielectric structure 108, and an opening 112 (e.g., aperture, via) vertically extending through the third dielectric structure 110 and the second dielectric structure 108 to upper surfaces of the contact structure 104 and the dielectric liner 106. As shown in FIG. 1A, the opening 112 may expose the upper surfaces of the contact structure 104 and the dielectric liner 106, while upper surfaces of the first dielectric structure 102 remain substantially covered by the second dielectric structure 108 (and the third dielectric structure 110 overlying the second dielectric structure 108). The upper surfaces of the contact structure 104 and the dielectric liner 106 may be substantially coplanar with one another.

The first dielectric structure 102 may be formed of and include at least one dielectric material. By way of non-limiting example, the first dielectric structure 102 may be formed of and include at least one oxygen-containing dielectric material, such as a one or more of a dielectric oxide material (e.g., one or more of silicon oxide ($SiO_x$), phosphosilicate glass, borosilicate glass, borophosphosilicate glass, fluorosilicate glass, aluminum oxide ($AlO_x$), hafnium oxide ($HfO_x$), niobium oxide ($NbO_x$), and titanium oxide ($TiO_x$)), a dielectric oxynitride material (e.g., silicon oxynitride ($SiO_xN_y$)), and a dielectric carboxynitride material (e.g., silicon carboxynitride ($SiO_xC_zN_y$)). Formulae including one or more of "x", "y", and "z" herein represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the first dielectric structure 102 is formed of and includes $SiO_2$.

The contact structure 104 may be formed of and include of a doped (e.g., conductively doped) semiconductive material, such as one or more of a doped silicon material, a doped silicon-germanium material, a doped germanium material, a doped gallium arsenide material, a doped gallium nitride material, and a doped indium phosphide material. By way of non-limiting example, the contact structure 104 may be formed of and include at least one doped silicon material. As used herein, the term "silicon material" means and includes a material that includes elemental silicon or a compound of silicon. The contact structure 104 may, for example, be formed of and include one or more of doped monocrystalline silicon and doped polycrystalline silicon. In some embodiments, the contact structure 104 comprises doped polycrystalline silicon. The contact structure 104 may serve as a source region or a drain region for a vertical transistor (e.g., a vertical access device). For example, the contact structure 104 may vertically overlie a semiconductive material (e.g., an undoped semiconductor material, a doped semiconductor material) serving as a channel region of the vertical transistor.

The contact structure 104 may be doped with at least one conductive dopant. As a non-limiting example, the semiconductive material of the contact structure 104 may be doped with at least one N-type dopant (e.g., one or more of phosphorus, arsenic, antimony, and bismuth). Thus, the contact structure 104 may exhibit excesses of free electrons. As another non-limiting example, the semiconductive material of the contact structure 104 may be doped with at least one P-type dopant (e.g., one or more of boron, aluminum, and gallium). Thus, the contact structure 104 may exhibit deficiencies of valence electrons (commonly referred to as "holes"). In some embodiments, the contact structure 104 comprises polycrystalline silicon doped with at least one N-type dopant.

The contact structure 104 may be formed to exhibit any desired dimensions (e.g., horizontal dimensions, vertical dimensions) and any desired shape. By way of non-limiting example, the contact structure 104 may be formed to exhibit a cylindrical column shape having a substantially circular horizontal cross-sectional shape and a horizontal diameter (e.g., width) less than or equal to about 200 Å (e.g., less than or equal to about 150 Å, less than or equal to about 100 Å). In some embodiments, the contact structure 104 exhibits a horizontal diameter less than or equal to about 100 Å.

With continued reference to FIG. 1A, the dielectric liner 106 may substantially surround side surfaces (e.g., sidewalls) of the contact structure 104. In some embodiments, the dielectric liner 106 completely covers the side surfaces of the contact structure 104. As shown in FIG. 1A, the dielectric liner 106 may horizontally intervene between the side surfaces of the contact structure 104 and side surfaces of the first dielectric structure 102. The dielectric liner 106 may be formed to exhibit any desirable width (e.g., horizontal thickness) between the opposing side surfaces of the contact structure 104 and the first dielectric structure 102. By way of non-limiting example, a width of the dielectric liner 106 may be less than or equal to about 150 Å, such as less than or equal to about 100 Å, less than or equal to about 50 Å, less than or equal to about 30 Å, or less than or equal to about 15 Å. In some embodiments, the width of the dielectric liner 106 is less than or equal to about 30 Å.

The dielectric liner 106 may be formed of and include at least one dielectric material. By way of non-limiting example, the dielectric liner 106 may be formed of and include at least one dielectric material substantially free of oxygen, such as one or more of a dielectric nitride material (e.g., silicon nitride ($SiN_y$)), and a dielectric carbonitride material (e.g., silicon carbonitride ($SiC_zN_y$)). In some embodiments, the dielectric liner 106 is formed of and includes $SiN_y$ (e.g., $Si_3N_4$).

The second dielectric structure 108 may be formed on or over the first dielectric structure 102. As shown in FIG. 1A, the second dielectric structure 108 may substantially cover upper surfaces of the first dielectric structure 102. The second dielectric structure 108 may vertically intervene between the first dielectric structure 102 and the third dielectric structure 110. The second dielectric structure 108 may be formed to exhibit any desirable height (e.g., vertical thickness) between the first dielectric structure 102 and the third dielectric structure 110. By way of non-limiting example, a height of the second dielectric structure 108 may be less than or equal to about 150 Å, such as less than or equal to about 100 Å, less than or equal to about 50 Å, less than or equal to about 30 Å, or less than or equal to about 15 Å. In some embodiments, the height of the second dielectric structure 108 is less than or equal to about 30 Å.

The second dielectric structure 108 may be formed of and include at least one dielectric material. By way of non-limiting example, the second dielectric structure 108 may be formed of and include at least one dielectric material substantially free of oxygen, such as one or more of a dielectric nitride material (e.g., $SiN_y$), and a dielectric carbonitride material (e.g., $SiC_zN_y$). A material composition of the second dielectric structure 108 may be substantially the same as or may be different than that of the dielectric liner 106. In some embodiments, the second dielectric structure 108 is formed of and includes $SiN_y$ (e.g., $Si_3N_4$).

The third dielectric structure 110 may be formed on or over the second dielectric structure 108. As shown in FIG. 1A, the third dielectric structure 110 may substantially cover upper surfaces of the second dielectric structure 108. The third dielectric structure 110 may be formed to exhibit any desirable height (e.g., vertical thickness). By way of non-limiting example, a height of the third dielectric structure 110 may be greater than or equal to about 500 Å, such as greater than or equal to about 1000 Å.

The third dielectric structure 110 may be formed of and include at least one dielectric material. By way of non-limiting example, the third dielectric structure 110 may be formed of and include at least one oxygen-containing dielectric material, such as a one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), a dielectric oxynitride material (e.g., $SiO_xN_y$), and a dielectric carboxynitride material (e.g., $SiO_xC_zN_y$). A material composition of the third dielectric structure 110 may be substantially the same as or may be different than that of the second dielectric structure 108. In some embodiments, the third dielectric structure 110 is formed of and includes $SiO_x$ (e.g., $SiO_2$).

With continued reference to FIG. 1A, the opening 112 may vertically extend from and between an upper surface of the third dielectric structure 110 and an upper surface of the contact structure 104. A width (e.g., diameter) of the opening 112 may be greater than or equal to the width of the contact structure 104. As shown in FIG. 1A, in some embodiments, the width of the opening corresponds (e.g., is equal to) to the width of the contact structure 104 plus the widths of the dielectric liner 106 between the opposing side surfaces of the contact structure 104 and the first dielectric structure 102.

The first dielectric structure 102, the contact structure 104, the dielectric liner 106, the second dielectric structure 108, the third dielectric structure 110, and the opening 112 may be formed using conventional processes (e.g., conventional deposition processes, such as one or more of in situ growth, spin-on coating, blanket coating, CVD, PECVD, ALD, and PVD; conventional material removal processes, such as conventional photolithography processes and conventional etching processes; conventional doping processes, such as one or more of conventional ion implantation processes and conventional dopant diffusion processes), which are not described in detail herein.

Referring next to FIG. 1B, a metal silicide material 114 may be formed on or over exposed upper surfaces of the contact structure 104 and the dielectric liner 106 within the opening 112, and on or over exposed upper surfaces of the third dielectric structure 110 outside of the opening 112. As shown in FIG. 1B, the metal silicide material 114 may at least partially (e.g., substantially) cover and extend from and between side surfaces (e.g., sidewalls) of the second dielectric structure 108 within the opening 112. In addition, side surfaces of the third dielectric structure 110 within the opening 112 may be substantially free of the metal silicide material 114 thereon (e.g., directly horizontally adjacent thereto) or thereover (e.g., indirectly horizontally adjacent thereto). In further embodiments, the side surfaces of the third dielectric structure 110 within the opening 112 are at least partially (e.g., substantially) covered by the metal silicide material 114.

The metal silicide material 114 may be formed of and include at least one metal silicide. By way of non-limiting example, the metal silicide material 114 may comprise one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$). In some embodiments, the metal silicide material 114 comprises $TiSi_x$.

The metal silicide material 114 may be substantially homogeneous or may be heterogeneous. In some embodiments, the metal silicide material 114 is substantially homogeneous, such that the metal silicide material 114 exhibits a substantially uniform (e.g., even, non-variable) distribution of the elements thereof. For example, amounts (e.g., atomic concentrations) of each element (e.g., one or more metals, Si) included in the metal silicide material 114 may not vary throughout the dimensions (e.g., horizontal dimensions, vertical dimensions) of the metal silicide material 114. In additional embodiments, the metal silicide material 114 is substantially heterogeneous, such that the metal silicide material 114 exhibits a substantially non-uniform (e.g., non-even, variable) distribution of one or more of the elements thereof. For example, amounts (e.g., atomic concentrations) of one or more elements (e.g., one or more metals, Si) included in the metal silicide material 114 may vary throughout dimensions of the metal silicide material 114. Amounts of the one or more elements may vary stepwise (e.g., change abruptly), or may vary continuously (e.g., change progressively, such as linearly, parabolically) throughout different portions of the metal silicide material 114.

The metal silicide material 114 may be formed to exhibit any desirable height (e.g., vertical thickness). As shown in FIG. 1B, in some embodiments the height of the metal silicide material 114 is less than or equal to the height of the second dielectric structure 108. In additional embodiments, the height of the metal silicide material 114 is great than the height of the second dielectric structure 108. A height of the metal silicide material 114 may, for example, be less than or equal to about 150 Å, such as less than or equal to about 100 Å, less than or equal to about 50 Å, less than or equal to about 30 Å, or less than or equal to about 15 Å. In some embodiments, the height of the metal silicide material 114 is within a range of from about 15 Å to about 120 Å. In further embodiments, the height of the metal silicide material 114 is about 58 Å.

The metal silicide material 114 may be formed using one or more conventional non-conformal deposition processes, such as one or more of a conventional PVD process (e.g., a conventional radio frequency PVD (RFPVD) process) and a conventional non-conformal CVD process. By way of non-limiting example, a metal (e.g., titanium (Ti)) and silicon may be sputtered (e.g., radio frequency (RF) sputtered) from at least one target onto the exposed upper surfaces of the contact structure 104, the dielectric liner 106, and the third dielectric structure 110. In some embodiments, a RFPVD process is used to form the metal silicide material 114. The RFPVD process may, for example, a employ 13.56 megahertz (MHz) power supplies, a target having mole ratio of metal (e.g., Ti) to Si of about 1 to 2.5, and an inert (e.g., argon) atmosphere at a pressure of about 68 millitorr (mTorr) and a temperature of about 25° C.

Figure 1D:
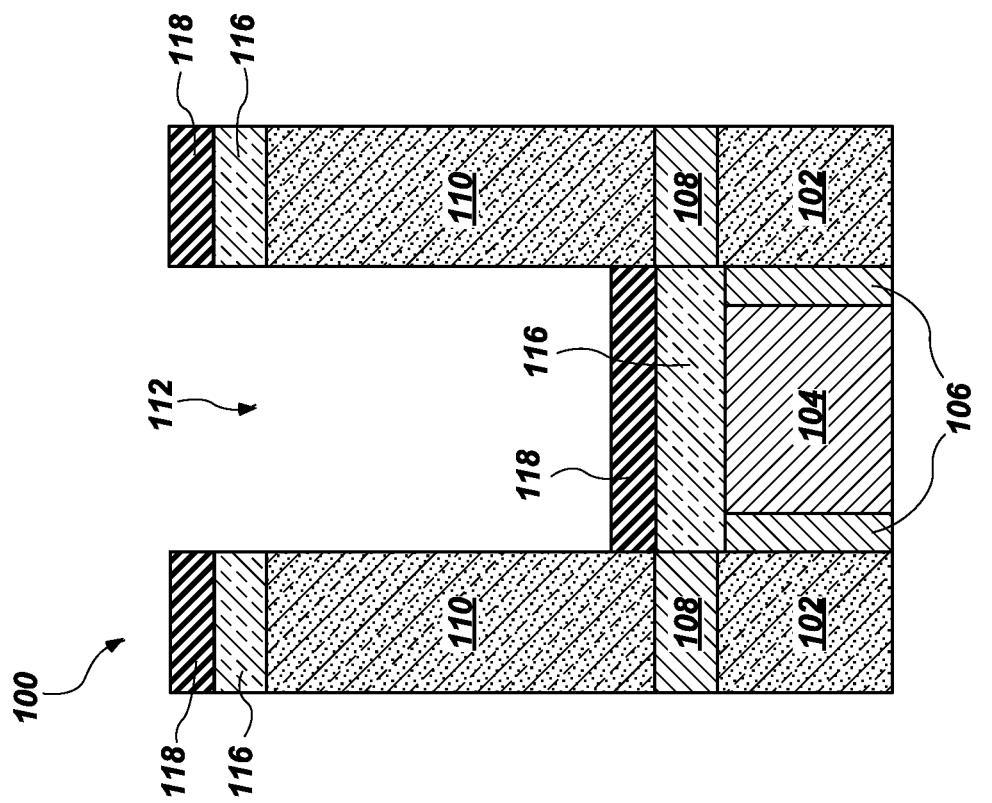
Figure 1C:
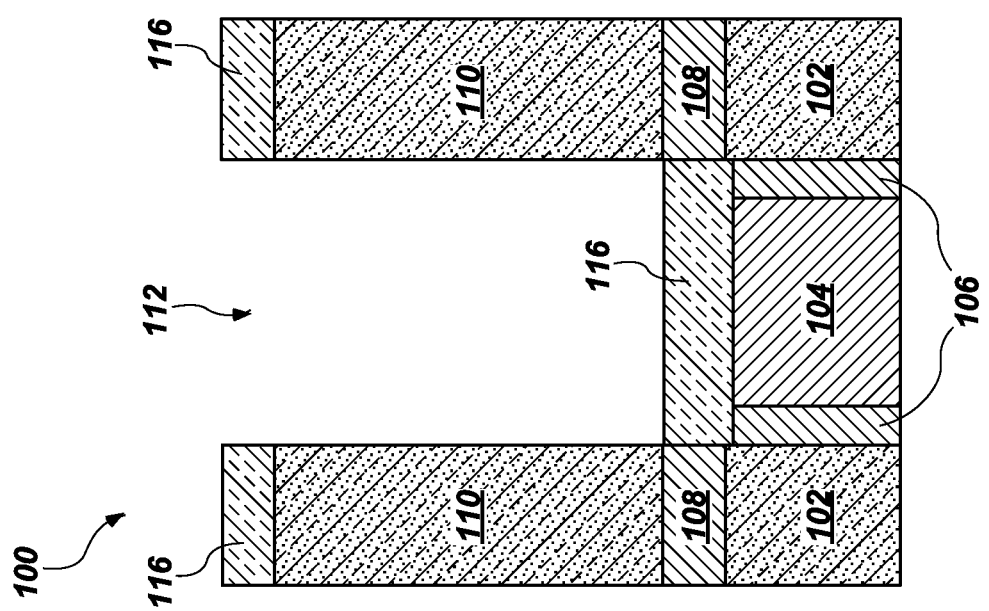

Referring next to FIG. 1C, the metal silicide material 114 (FIG. 1B) may be subjected to a nitridation process to form a metal silicon nitride material 116. The nitridation process may substantially convert the metal silicide material 114 (FIG. 1B) to the metal silicon nitride material 116, such that the metal silicon nitride material 116 is located on or over the upper surfaces of the contact structure 104 and the dielectric liner 106 at a lower end of the opening 112, and on or over the upper surfaces of the third dielectric structure 110 outside of the opening 112. As shown in FIG. 1C, the metal silicon nitride material 116 may at least partially (e.g., substantially) cover and extend from and between side surfaces (e.g., sidewalls) of the second dielectric structure 108 within the opening 112. In addition, side surfaces of the third dielectric structure 110 within the opening 112 may be substantially free of the metal silicon nitride material 116 thereon (e.g., directly horizontally adjacent thereto) or thereover (e.g., indirectly horizontally adjacent thereto). In further embodiments, the side surfaces of the third dielectric structure 110 within the opening 112 are at least partially (e.g., substantially) covered by the metal silicon nitride material 116. The metal silicon nitride material 116 may inhibit (e.g., impede, prevent) the formation of metal silicide within the contact structure 104 since nitrogen (N) atoms of the metal silicon nitride material 116 may suppress (e.g., impede, prevent) the migration (e.g., diffusion) of metal atoms into the contact structure 104.

The metal silicon nitride material 116 may be of and include at least one metal silicon nitride. By way of non-limiting example, the metal silicon nitride material 116 may comprise one or more of titanium silicon nitride ($TiSi_xN_y$), cobalt silicon nitride ($CoSi_xN_y$), tungsten silicon nitride ($WSi_xN_y$), tantalum silicon nitride ($TaSi_xN_y$), molybdenum silicon nitride ($MoSi_xN_y$), and nickel silicon nitride ($NiSi_xN_y$). In some embodiments, the metal silicon nitride material 116 comprises $TiSi_xN_y$. N atoms of the $TiSi_xN_y$ may suppress the migration of Ti atoms of the $TiSi_xN_y$ into the contact structure 104 to inhibit the formation of titanium silicide ($TiSi_x$) within the contact structure 104.

The metal silicon nitride material 116 may be substantially homogeneous or may be heterogeneous. In some embodiments, the metal silicon nitride material 116 is substantially homogeneous, such that the metal silicon nitride material 116 exhibits a substantially uniform (e.g., even, non-variable) distribution of the elements thereof. For example, amounts (e.g., atomic concentrations) of each element (e.g., one or more metals, Si, N) included in the metal silicon nitride material 116 may not vary throughout the dimensions (e.g., horizontal dimensions, vertical dimensions) of the metal silicon nitride material 116. In additional embodiments, the metal silicon nitride material 116 is substantially heterogeneous, such that the metal silicon nitride material 116 exhibits a substantially non-uniform (e.g., non-even, variable) distribution of one or more of the elements thereof. For example, amounts (e.g., atomic concentrations) of one or more elements (e.g., one or more metals, Si, N) included in the metal silicon nitride material 116 may vary throughout dimensions of the metal silicon nitride material 116. Amounts of the one or more elements may vary stepwise (e.g., change abruptly), or may vary continuously (e.g., change progressively, such as linearly, parabolically) throughout different portions of the metal silicon nitride material 116. In some embodiments, a first vertical portion (e.g., a vertically upper portion) of the metal silicon nitride material 116 comprises $TiSi_2N_y$, wherein y is less than one (1); and a second vertical portion (e.g., a vertically lower portion) of the metal silicon nitride material 116 comprises TiSiN.

The metal silicon nitride material 116 may be formed using one or more conventional nitridation processes, which are not described in detail herein. As a non-limiting example, the metal silicide material 114 (FIG. 1B) may be exposed to a nitrogen-containing atmosphere (e.g., an atmosphere containing one or more of nitrogen ($N_2$) gas and ammonia ($NH_3$)) to convert the metal silicide material 114 (FIG. 1B) into the metal silicon nitride material 116. The nitrogen-containing atmosphere may be substantially free of oxidizing agents (e.g., oxygen ($O_2$) gas). In some embodiments, the metal silicide material 114 (FIG. 1B) is exposed to a gaseous mixture of $N_2$ and Ar and a partial pressure ratio of 5:1 at a pressure of about 1.9 mTorr and a temperature of about 25° C. to form the metal silicon nitride material 116. As a non-limiting example, the metal silicide material 114 (FIG. 1B) may be exposed to a plasma nitridation process (e.g., a remote plasma nitridation (RPN) process, a decoupled plasma nitridation (DPN) process) to convert the metal silicide material 114 (FIG. 1B) into the metal silicon nitride material 116.

Referring next to FIG. 1D, a first metal nitride material 118 may be formed on or over exposed upper surfaces of the metal silicon nitride material 116 inside and outside of the opening 112. As shown in FIG. 1D, the first metal nitride material 118 may partially cover and extend from and between lower portions of side surfaces (e.g., sidewalls) of the third dielectric structure 110 within the opening 112. Upper portions of the side surfaces of the third dielectric structure 110 within the opening 112 may be substantially free of the first metal nitride material 118 thereon (e.g., directly horizontally adjacent thereto) or thereover (e.g., indirectly horizontally adjacent thereto). Keeping the upper portions of the side surfaces of the third dielectric structure 110 free of (e.g., not covered by) the first metal nitride material 118 thereon or thereover may facilitate the subsequent formation of a conductive structure having relatively larger horizontal dimensions within the opening 112 (as compared to a conductive structure that may otherwise be formed if the first metal nitride material 118 was formed on or over the upper portions of the side surfaces of the third dielectric structure 110), as described in further detail below. In further embodiments, upper portions of the side surfaces of the third dielectric structure 110 within the opening 112 are at least partially (e.g., substantially) covered by the first metal nitride material 118. The first metal nitride material 118 may suppress (e.g., inhibit, prevent) undesirable surface oxidation of the metal silicon nitride material 116 that may otherwise negatively impact contact resistance.

The first metal nitride material 118 may be formed of and include at least one metal nitride. The first metal nitride material 118 may, for example, comprise at least one refractory metal nitride, such as one or more nitrides of one or more elements of Groups IIIA, IVA, VA, and VIA of the Periodic Table of Elements. By way of non-limiting example, the first metal nitride material 118 may comprise one or more of titanium nitride ($TiN_y$), tungsten nitride ($WN_y$), tantalum nitride ($TaN_y$), and molybdenum nitride ($MoN_y$). In some embodiments, the first metal nitride material 118 comprises $TiN_y$ (e.g., TiN).

The first metal nitride material 118 may be formed to exhibit any desirable height (e.g., vertical thickness). A height of the first metal nitride material 118 may, for example, be less than or equal to about 150 Å, such as less than or equal to about 100 Å, less than or equal to about 50 Å, less than or equal to about 30 Å, or less than or equal to about 15 Å. In some embodiments, the height of the first metal nitride material 118 is within a range of from about 15 Å to about 120 Å. In further embodiments, the height of the first metal nitride material 118 is about 55 Å.

The first metal nitride material 118 may be formed using one or more conventional non-conformal deposition processes, such as one or more of a conventional PVD process and a conventional non-conformal CVD process. By way of non-limiting example, a metal (e.g., Ti) may be sputtered from at least one target onto the exposed upper surfaces of the metal silicon nitride material 116 under a nitrogen-containing atmosphere. The process may, for example, employ an atmosphere (e.g., an oxidizing agent free atmosphere) containing a gaseous mixture of $N_2$ and Ar, a partial pressure ratio of 5:1, a pressure of about 1.8 mTorr, and a temperature of about 25° C.

Figures 1E, 1F:
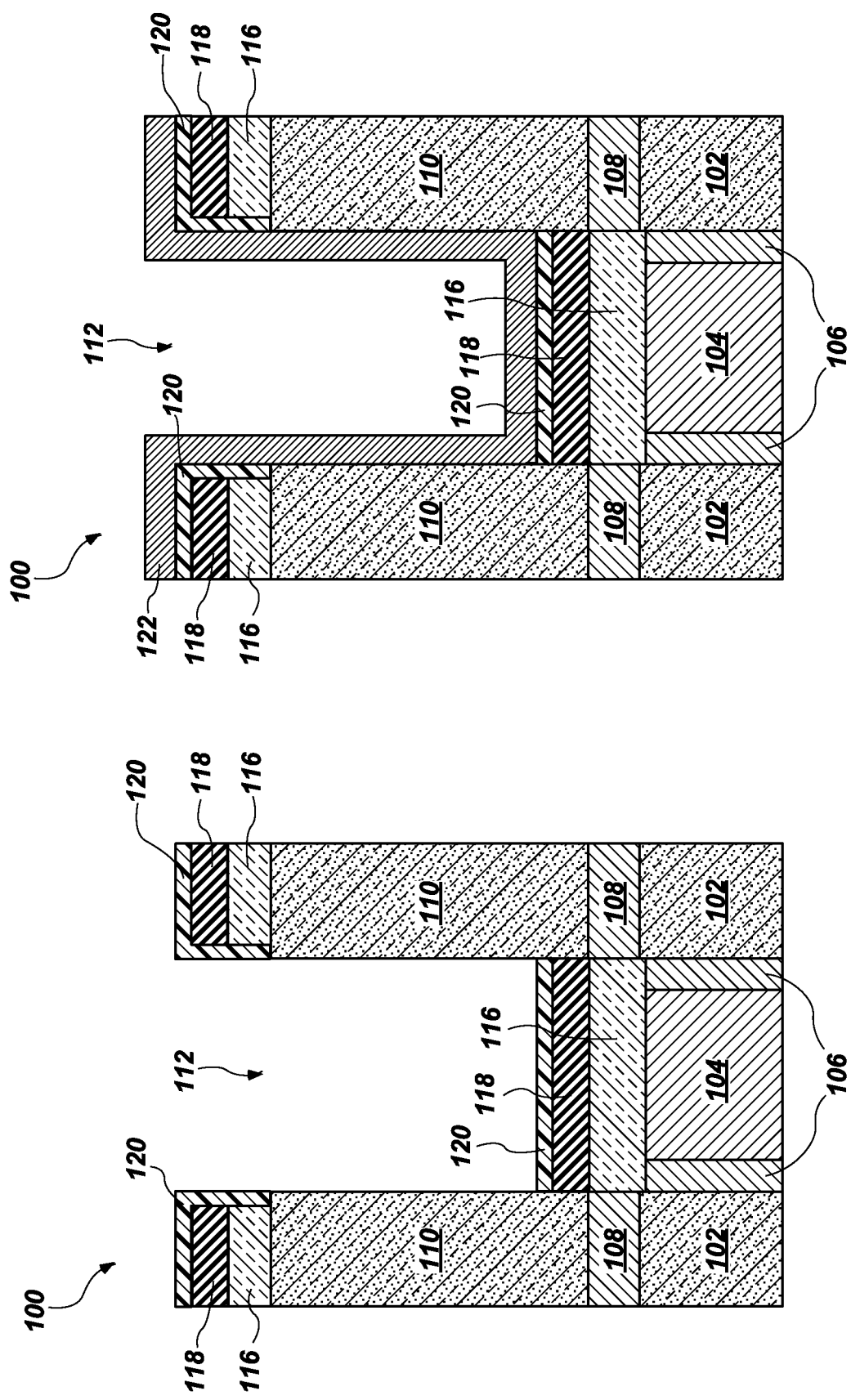

Referring next to FIG. 1E, optionally, a native oxide material 120 may be formed on or over exposed surfaces of the first metal nitride material 118 inside and outside of the opening 112, and on or over exposed surfaces of the metal silicon nitride material 116 within the opening 112. As shown in FIG. 1E, a first region of the native oxide material 120 may be formed on exposed upper surfaces of the first metal nitride material 118 within the opening 112, a second region of the native oxide material 120 may be formed on exposed side surfaces of the first metal nitride material 118 within the opening 112, a third region of the native oxide material 120 may be formed on exposed side surfaces of the metal silicon nitride material 116 within the opening 112, and a fourth region of the native oxide material 120 may be formed on exposed upper surfaces of the first metal nitride material 118 outside of the opening 112. In further embodiments, the native oxide material 120 is not formed on or over exposed surfaces of the first metal nitride material 118 and the metal silicon nitride material 116.

The native oxide material 120, if any, may be formed of native oxides of the first metal nitride material 118 and the metal silicon nitride material 116. Regions (e.g., the first region, the second region, and the fourth region) of the native oxide material 120 on the first metal nitride material 118 may, for example, comprise at least one metal oxynitride, such as at least one refractory metal oxynitride. By way of non-limiting example, regions (e.g., the first region, the second region, and the fourth region) of the native oxide material 120 on the first metal nitride material 118 may comprise one or more of one or more of titanium oxynitride ($TiO_zN_y$), tungsten oxynitride ($WO_zN_y$), tantalum oxynitride ($TaO_zN_y$), and molybdenum oxynitride ($MoO_zN_y$). In addition, further regions (e.g., the third region) of the native oxide material 120 on the metal silicon nitride material 116 may comprise at least one metal silicon-oxynitride material, such as one or more of titanium silicon-oxynitride ($TiSi_xO_zN_y$), tungsten silicon-oxynitride ($WSi_xO_zN_y$), tantalum silicon-oxynitride ($TaSi_xO_zN_y$), cobalt silicon-oxynitride ($CoSi_xO_zN_y$), molybdenum silicon-oxynitride ($MoSi_xO_zN_y$), and nickel silicon-oxynitride ($NiSi_xO_zN_y$). In some embodiments, the native oxide material 120 comprises $TiO_zN_y$ on the first metal nitride material 118 and $TiSi_xO_zN_y$ on the metal silicon nitride material 116.

The native oxide material 120, if any, may be formed to exhibit any desirable height (e.g., vertical thickness) facilitating the flow of tunnel currents through portions thereof overlying the contact structure 104. A height of the native oxide material 120 may, for example, be less than or equal to about 25 Å, such as less than or equal to about 20 Å, less than or equal to about 15 Å, or less than or equal to about 10 Å. In some embodiments, the height of the native oxide material 120 is less than or equal to about 20 Å. In additional embodiments, the native oxide material 120 is omitted.

The native oxide material 120, if any, may be formed using one or more conventional oxidation processes, which are not described in detail herein. As a non-limiting example, the first metal nitride material 118 and the metal silicon nitride material 116 may be exposed to an oxygen-containing atmosphere (e.g., an atmosphere containing $O_2$ gas and/or another oxidizing agent) to form the native oxide material 120. In some embodiments, the first metal nitride material 118 and the metal silicon nitride material 116 are exposed to air for a sufficient period of time to form the native oxide material 120 thereon. In additional embodiments, the first metal nitride material 118 and the metal silicon nitride material 116 are not exposed to an oxygen-containing atmosphere, and the native oxide material 120 is not formed thereon.

Referring next to FIG. 1F, a second metal nitride material 122 may be formed on or over surfaces inside and outside of the opening 112. For example, as shown in FIG. 1F, in embodiments wherein the native oxide material 120 is formed, the second metal nitride material 122 may be conformally formed on exposed surfaces of the native oxide material 120 and the third dielectric structure 110 inside and outside of the opening 112. As another example, in additional embodiments wherein the native oxide material 120 is not formed, the second metal nitride material 122 may be conformally formed on exposed surfaces of the first metal nitride material 118, the metal silicon nitride material 116, and the third dielectric structure 110 inside and outside of the opening 112.

The second metal nitride material 122 may be formed of and include at least one metal nitride. By way of non-limiting example, the second metal nitride material 122 may, for example, comprise at least one refractory metal nitride, such as one or more nitrides of one or more elements of Groups IIIA, IVA, VA, and VIA of the Periodic Table of Elements. By way of non-limiting example, the second metal nitride material 122 may comprise one or more of $TiN_y$, $WN_y$, $TaN_y$, and $MoN_y$. A material composition of the second metal nitride material 122 may be substantially the same as or may be different than that of the first metal nitride material 118. In some embodiments, the second metal nitride material 122 comprises $TiN_y$ (e.g., TiN).

The second metal nitride material 122 may be formed to exhibit any desirable thickness. A thickness of the second metal nitride material 122 may, for example, be less than or equal to about 100 Å, such as less than or equal to about 75 Å, less than or equal to about 50 Å, less than or equal to about 30 Å, or less than or equal to about 15 Å. In some embodiments, the thickness of the second metal nitride material 122 is within a range of from about 15 Å to about 75 Å. In further embodiments, the thickness of the second metal nitride material 122 is about 30 Å.

The second metal nitride material 122 may be formed using one or more conventional conformal deposition processes, such as one or more of a conventional conformal CVD process and a conventional ALD process. For example, the apparatus 100 (at the processing stage depicted in FIG. 1E) may be provided into a deposition chamber (an ALD chamber, a CVD chamber) configured to receive alternating pulses of at least one metal-containing reactant and at least one nitrogen-containing reactant. The metal-containing reactant may comprise a complex of at least one metal species (e.g., Ti, W, Ta, Co, Mo, Ni) for inclusion in second metal nitride material 122 and at least one ligand formulated to react with the nitrogen-containing reaction to form at least a portion of the second metal nitride material 122. In some embodiments, the metal-containing reactant comprises titanium tetrachloride ($TiCl_4$) and the nitrogen-containing reactant comprises $NH_3$. In such embodiments, the presence of the first metal nitride material 118 (and, optionally, the native oxide material 120) may impede (e.g., inhibit, prevent) undesirable diffusion of the N and Cl into the metal silicon nitride material 116 and the contact structure 104 during the formation of the second metal nitride material 122.

Figure 1G:
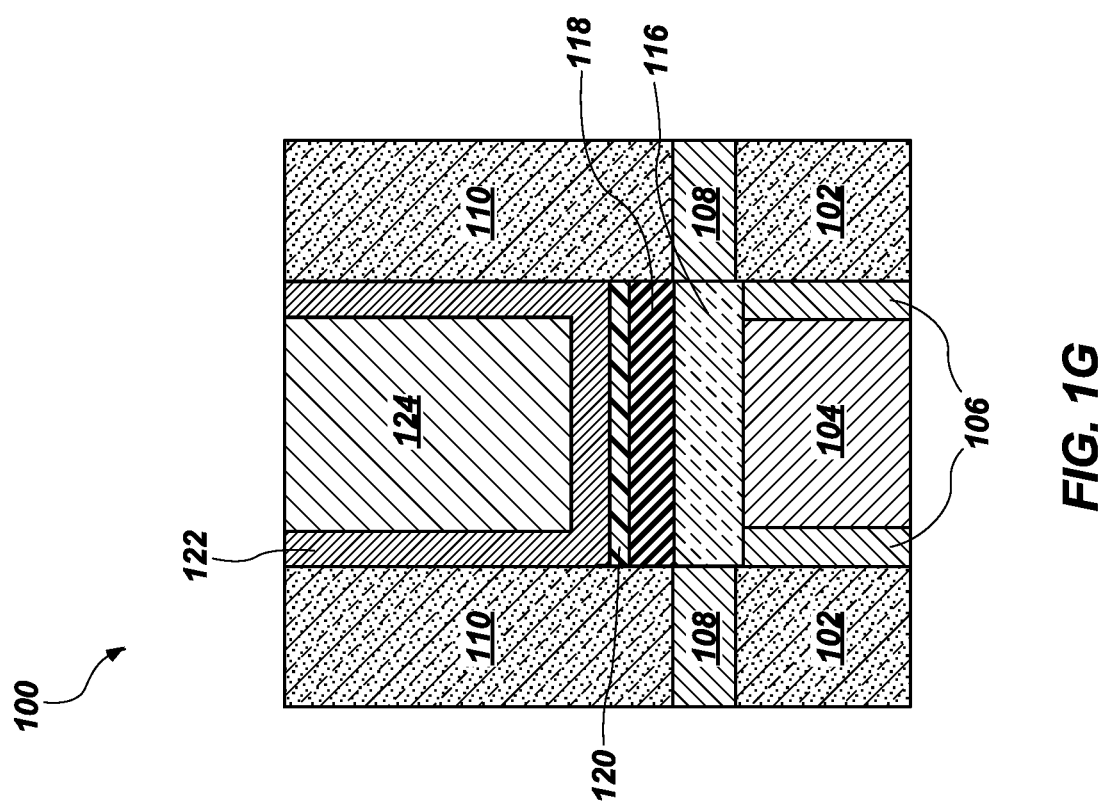

Referring next to FIG. 1G, a conductive structure 124 (e.g., a conductive plug) may be formed within a remaining (e.g., unfilled) portion of the opening 112 (FIG. 1F), and portions of the metal silicon nitride material 116, the first metal nitride material 118, the native oxide material 120 (if any), and the second metal nitride material 122 vertically extending beyond (e.g., vertically overlying) a horizontal plane of the upper surface of the third dielectric structure 110 may be removed to expose the upper surface of the third dielectric structure 110. As shown in FIG. 1G, the conductive structure 124 may be formed on portions of the second metal nitride material 122 within the opening 112 (FIG. 1F) and may horizontally extend from and between opposing side surfaces of the second metal nitride material 122 within the opening 112 (FIG. 1F). An upper surface of the conductive structure 124 may be substantially coplanar with upper surfaces of the second metal nitride material 122 and the third dielectric structure 110.

The conductive structure 124 may be formed of and include at least one electrically conductive material, such as one or more of a metal, an alloy, a conductive metal oxide, a conductive metal nitride, a conductive metal silicide, and a conductively doped semiconductor material. By way of non-limiting example, the conductive structure 124 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), and conductively doped silicon. In some embodiments, the conductive structure 124 is formed of and includes W.

The conductive structure 124 may be formed using conventional processes (e.g., conventional material deposition process, conventional material removal processes), which are not described in detail herein. By way of non-limiting example, a conductive material may be non-conformally formed (e.g., non-conformally deposited through a CVD process) on exposed surfaces of the second metal nitride material 122 inside and outside of the opening 112 (FIG. 1F); and then portions of the conductive material, the second metal nitride material 122, the native oxide material 120 (if any), the first metal nitride material 118, and the metal silicon nitride material 116 vertically extending beyond a horizontal plane defined by the upper surface of the third dielectric structure 110 may be removed (e.g., by way of an abrasive planarization process, such as a CMP process) to form the conductive structure and expose the upper surface of the third dielectric structure 110.

Thus, in accordance with embodiments of the disclosure, a method of forming an apparatus comprises forming a first metal nitride material over an upper surface of a conductive material within an opening extending through at least one dielectric material through a non-conformal deposition process. A second metal nitride material is formed over an upper surface of the first metal nitride material and side surfaces of the at least one dielectric material partially defining boundaries of the opening through a conformal deposition process. A conductive structure is formed over surfaces of the second metal nitride material within the opening.

Furthermore, an apparatus according to embodiments of the disclosure comprises at least one contact structure, and at least one filled opening vertically overlying and aligned with the at least one contact structure. The at least one filled opening extends through at least one dielectric material and comprises a conductive material, a first metal nitride material, a second metal nitride material, and a conductive structure. The conductive material vertically overlies an upper surface of the at least one contact structure, and upper portions of side surfaces of the at least one dielectric material are substantially free of the conductive material horizontally thereover. The first metal nitride material vertically overlies an upper surface of the conductive material, and the upper portions of the side surfaces of the at least one dielectric material are substantially free of the first metal nitride material horizontally thereover. The second metal nitride material vertically overlies an upper surface of the first metal nitride material and horizontally overlies the upper portions of the side surfaces of the at least one dielectric material. The conductive structure overlies surfaces of the second metal nitride material.

The methods described with reference to FIGS. 1A through 1G facilitate the formation of an apparatus (e.g., the apparatus 100 at or after the processing stage depicted in FIG. 1G) exhibiting enhanced properties as compared to many conventional apparatuses. For example, employing the apparatus 100 described with reference to FIG. 1G within a vertical field effect transistor may decrease off-state current ($T_{off}$) as compared to many conventional vertical field effect transistors since the metal silicon nitride material 116 (e.g., $TiSi_xN_y$) is substantially flat and inhibits the formation and presence of metal silicides within the contact structure 104. In addition, drive currents ($I_{on}$) may be enhanced as compared to those of conventional vertical field effect transistors requiring a silicide formation step employing an annealing act at a temperature greater than or equal to about 550° C. Furthermore, the methods of the disclosure eliminate many of the processing acts (e.g., rapid thermal processing (RTP) acts, material deposition acts, material removal acts, cleaning acts) required to form many conventional apparatuses that may be used for similar operations as the apparatus 100.

Aspects (e.g., processing acts and structures) of the methods described above with reference to FIGS. 1A through 1G may be employed in additional methods of forming an apparatus to facilitate one or more benefits (e.g., at least some of the benefits effectuated by the methods previously described with reference to FIGS. 1A through 1G, and/or additional benefits) as compared to conventional methods and conventional apparatuses. By way of non-limiting example, FIGS. 2A through 2D are simplified partial cross-sectional views illustrating embodiments of an additional method of forming an apparatus (e.g., a semiconductor device, such as a DRAM device).

Figure 2B:
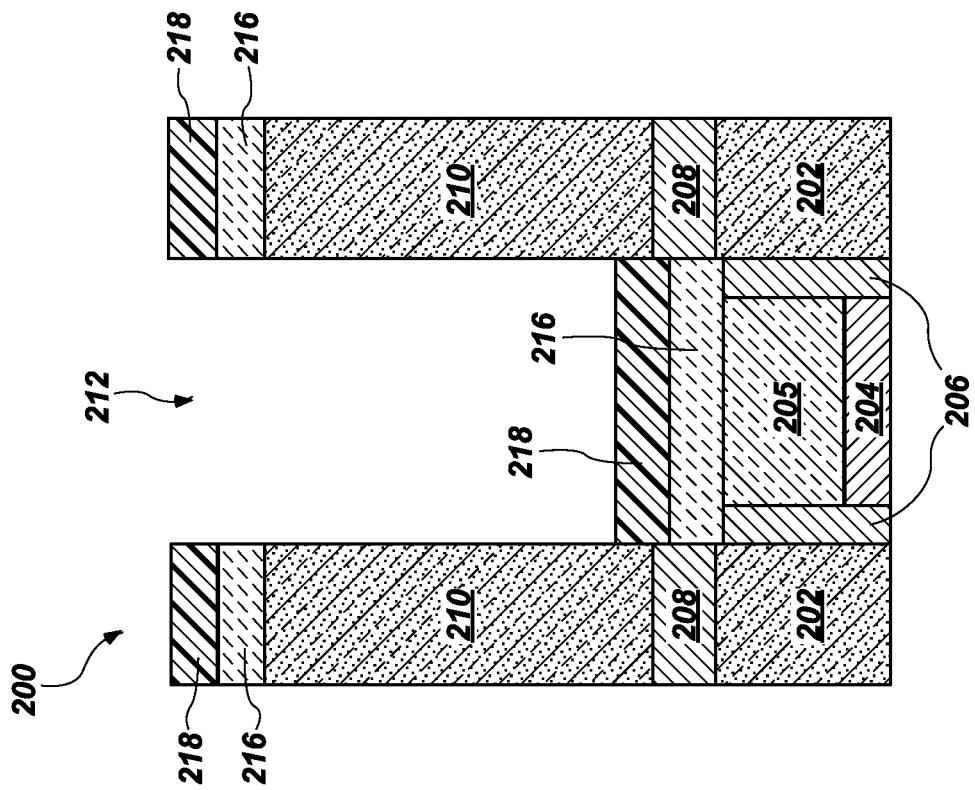
Figure 2A:
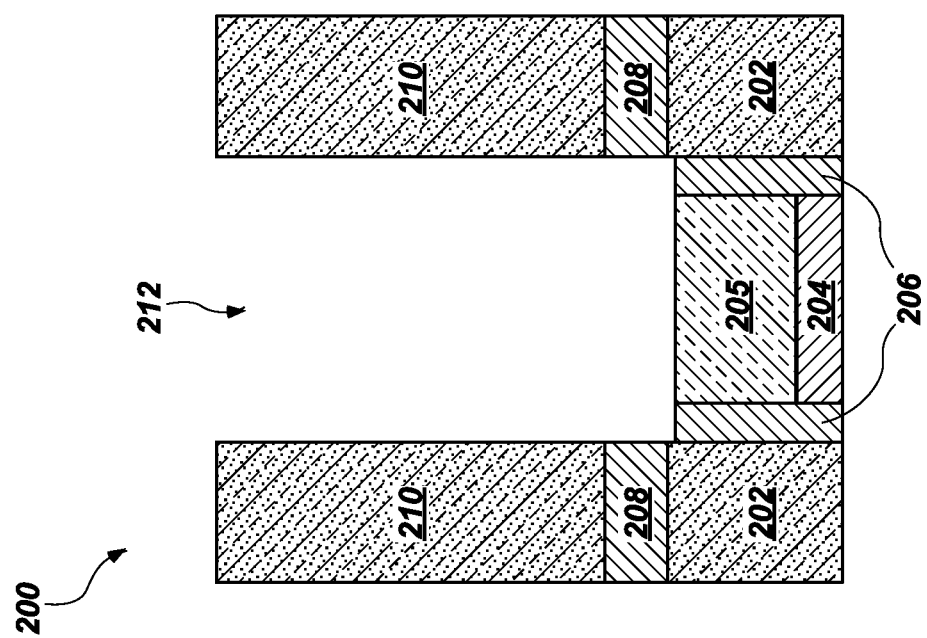

Referring to FIG. 2A, an apparatus 200 may include a first dielectric structure 202, a contact structure 204 vertically extending through a portion of the first dielectric structure 202, a metal silicide material 205 vertically overlying the contact structure 204, a dielectric liner 206 horizontally extending from and between the first dielectric structure 202 and each of the contact structure 204 and the metal silicide material 205, a second dielectric structure 208 vertically overlying at least the first dielectric structure 202, a third dielectric structure 210 vertically overlying at least the second dielectric structure 208, and an opening 212 (e.g., aperture, via) vertically extending through the third dielectric structure 210 and the second dielectric structure 208 to upper surfaces of the metal silicide material 205 and the dielectric liner 206. As shown in FIG. 2A, the opening 212 may expose the upper surfaces of the contact structure 204 and the dielectric liner 206, while upper surfaces of the first dielectric structure 202 remain substantially covered by the second dielectric structure 208 (and the third dielectric structure 210 overlying the second dielectric structure 208).

The upper surfaces of the metal silicide material 205 and the dielectric liner 206 may be substantially coplanar with one another.

The first dielectric structure 202, the dielectric liner 206, the second dielectric structure 208, the third dielectric structure 210, and the opening 212 may be substantially similar to (e.g., have substantially the sizes, shapes, material compositions, material distributions, and positions) the first dielectric structure 102, the dielectric liner 106, the second dielectric structure 108, the third dielectric structure 110, and the opening 112 previously described with reference to FIG. 1A, respectively. In addition, the contact structure 204 may be substantially similar to the contact structure 104 previously described with reference to FIG. 1A except that the contact structure 204 may exhibit a different height (e.g., vertical thickness) than the contact structure 104. For example, as shown in FIG. 1A, an upper boundary of the contact structure 204 may be vertically recessed relative to an upper boundary (e.g., upper surface) of the contact structure 104. The upper boundary of the contact structure 204 may be vertically lower than the upper surface of the dielectric liner 206. The relatively smaller height of the contact structure 204 as compared to the contact structure 104 may result from the formation of the metal silicide material 205 from an upper portion of an earlier form (e.g., a form from an earlier processing stage) of the contact structure 204.

The metal silicide material 205 may be formed of and include at least one metal silicide. By way of non-limiting example, the metal silicide material 205 may comprise one or more of $CoSi_x$, $WSi_x$, $TaSi_x$, $MoSi_x$, $NiSi_x$, and $TiSi_x$. In some embodiments, the metal silicide material 205 comprises $CoSi_x$ (e.g., $CoSi_2$).

The metal silicide material 205 may be substantially homogeneous or may be heterogeneous. In some embodiments, the metal silicide material 205 is substantially homogeneous, such that the metal silicide material 205 exhibits a substantially uniform (e.g., even, non-variable) distribution of the elements thereof. For example, amounts (e.g., atomic concentrations) of each element (e.g., one or more metals, Si) included in the metal silicide material 205 may not vary throughout the dimensions (e.g., horizontal dimensions, vertical dimensions) of the metal silicide material 205. In additional embodiments, the metal silicide material 205 is substantially heterogeneous, such that the metal silicide material 205 exhibits a substantially non-uniform (e.g., non-even, variable) distribution of one or more of the elements thereof. For example, amounts (e.g., atomic concentrations) of one or more elements (e.g., one or more metals, Si) included in the metal silicide material 114 may vary throughout dimensions of the metal silicide material 205. Amounts of the one or more elements may vary stepwise (e.g., change abruptly), or may vary continuously (e.g., change progressively, such as linearly, parabolically) throughout different portions of the metal silicide material 205.

The first dielectric structure 202, the contact structure 204, the metal silicide material 205, the dielectric liner 206, the second dielectric structure 208, the third dielectric structure 210, and the opening 212 may be formed using conventional processes (e.g., conventional deposition processes, such as one or more of in situ growth, spin-on coating, blanket coating, CVD, PECVD, ALD, and PVD; conventional material removal processes, such as conventional photolithography processes and conventional etching processes; conventional doping processes, such as one or more of conventional ion implantation processes and conventional dopant diffusion processes), which are not described in detail herein.

Referring next to FIG. 2B, a conductive material 216 may be formed on or over exposed upper surfaces of the metal silicide material 205 and the dielectric liner 206 inside of the opening 212, and on or over exposed upper surfaces of the third dielectric structure 210 outside of the opening 212; and a first metal nitride material 218 may be formed on or over exposed upper surfaces of the conductive material 216 inside and outside of the opening 212. As shown in FIG. 2B, the conductive material 216 may partially cover and extend from and between side surfaces (e.g., sidewalls) of the second dielectric structure 208 with the opening 212; and the first metal nitride material 218 may partially cover and extend from and between side surfaces (e.g., sidewalls) of one or more (e.g., each) of the second dielectric structure 208 and the third dielectric structure 210 with the opening 212. Upper portions of the side surfaces of the third dielectric structure 210 within the opening 212 may be substantially free of the conductive material 216 and the first metal nitride material 218 thereon (e.g., directly horizontally adjacent thereto) or thereover (e.g., indirectly horizontally adjacent thereto). Keeping the upper portions of the side surfaces of the third dielectric structure 210 free of (e.g., not covered by) the conductive material 216 and the first metal nitride material 218 thereon or thereover may facilitate the subsequent formation of a conductive structure having relatively larger horizontal dimensions within the opening 212 (as compared to a conductive structure that may otherwise be formed if the conductive material 216 and the first metal nitride material 218 were formed on or over the upper portions of the side surfaces of the third dielectric structure 210), as described in further detail below. In further embodiments, upper portions of the side surfaces of the third dielectric structure 210 within the opening 212 are at least partially (e.g., substantially) covered by one or more (e.g., each) of the conductive material 216 and the first metal nitride material 218.

The conductive material 216 may be formed of and include at least one electronically conductive material, such as one or more of a metal, an alloy, and a conductive metal silicide. The conductive material 216 may, for example, be formed of and include Ti, W, Ta, Mo, Ni, Co, alloys thereof, silicides thereof (e.g., $TiSi_x$, $WSi_x$, $TaSi_x$, $MoSi_x$, $NiSi_x$, $CoSi_x$), or combinations thereof. In some embodiments, the conductive material 216 is formed of and includes at least one elemental metal. By way of non-limiting example, the conductive material 216 may be formed of and include one or more of elemental Ti, elemental W, elemental Ta, elemental Mo, elemental Ni, and elemental Co. If employed, the metal of the conductive material 216 may be substantially the same as or may be different than the metal of the metal silicide material 205. In some embodiments, the conductive material 216 comprises elemental Ti. In additional embodiments, the conductive material 216 comprises $TiSi_x$ (e.g., $TiSi_2$).

The conductive material 216 may be formed to exhibit any desirable thickness. A thickness of the conductive material 216 may, for example, be less than or equal to about 150 Å, such as less than or equal to about 100 Å, less than or equal to about 75 Å, less than or equal to about 25 Å, or less than or equal to about 10 Å. In some embodiments, the thickness of the conductive material 216 is within a range of from about 3 Å to about 120 Å. In additional embodiments, the thickness of the conductive material 216 is about 9 Å.

The conductive material 216 may be formed using one or more conventional non-conformal deposition processes, such as one or more of a conventional PVD process and a conventional non-conformal CVD process. By way of non-limiting example, a metal (e.g., Ti) may be sputtered from at least one target onto the exposed upper surfaces of the metal silicide material 205. The process may, for example, employ an Ar atmosphere and a temperature of about 25° C.

The first metal nitride material 218 may be formed of and include at least one metal nitride. The first metal nitride material 218 may, for example, comprise at least one refractory metal nitride, such as one or more nitrides of one or more elements of Groups IIIA, IVA, VA, and VIA of the Periodic Table of Elements. By way of non-limiting example, the first metal nitride material 218 may comprise one or more of $TiN_y$, $WN_y$, $TaN_y$, and $MoN_y$. In some embodiments, the first metal nitride material 218 comprises $TiN_y$ (e.g., TiN).

The first metal nitride material 218 may be formed to exhibit any desirable height (e.g., vertical thickness). A height of the first metal nitride material 218 may, for example, be less than or equal to about 150 Å, such as less than or equal to about 120 Å, less than or equal to about 75 Å, less than or equal to about 50 Å, less than or equal to about 25 Å, or less than or equal to about 15 Å. In some embodiments, the height of the first metal nitride material 218 is within a range of from about 5 Å to about 120 Å. In further embodiments, the height of the first metal nitride material 218 is about 12 Å.

The first metal nitride material 218 may be formed using one or more conventional non-conformal deposition processes, such as one or more of a conventional PVD process and a conventional non-conformal CVD process. By way of non-limiting example, a metal (e.g., Ti) may be sputtered from at least one target onto the exposed upper surfaces of the conductive material 216 under a nitrogen-containing atmosphere. The process may, for example, employ an atmosphere (e.g., an oxidizing agent free atmosphere) containing a gaseous mixture of $N_2$ and Ar, a partial pressure ratio of 5:1, a pressure of about 1.9 mTorr, and a temperature of about 25° C.

Referring next to FIG. 2C, a second metal nitride material 222 may be formed on or over surfaces inside and outside of the opening 212. For example, as shown in FIG. 2C, the second metal nitride material 222 may be conformally formed on exposed surfaces of the first metal nitride material 218, the conductive material 216, and the third dielectric structure 210 inside and outside of the opening 212.

The second metal nitride material 222 may be formed of and include at least one metal nitride. The second metal nitride material 222 may, for example, comprise at least one refractory metal nitride, such as one or more nitrides of one or more elements of Groups IIIA, IVA, VA, and VIA of the Periodic Table of Elements. By way of non-limiting example, the first metal nitride material 218 may comprise one or more of $TiN_y$, $WN_y$, $TaN_y$, and $MoN_y$. A material composition of the second metal nitride material 222 may be substantially the same as or may be different than that of the first metal nitride material 218. In some embodiments, the second metal nitride material 222 comprises $TiN_y$ (e.g., TiN).

The second metal nitride material 222 may be formed to exhibit any desirable thickness. A thickness of the second metal nitride material 222 may, for example, be less than or equal to about 100 Å, such as less than or equal to about 75 Å, less than or equal to about 50 Å, less than or equal to about 30 Å, or less than or equal to about 15 Å. In some embodiments, the thickness of the second metal nitride material 222 is within a range of from about 15 Å to about 75 Å. In further embodiments, the thickness of the second metal nitride material 222 is about 30 Å.

The second metal nitride material 222 may be formed using one or more conventional conformal deposition processes, such as one or more of a conventional conformal CVD process and a conventional ALD process. For example, the apparatus 200 (at the processing stage depicted in FIG. 2C) may be provided into a deposition chamber (an ALD chamber, a CVD chamber) configured to receive alternating pulses of at least one metal-containing reactant and at least one nitrogen-containing reactant. The metal-containing reactant may comprise a complex of at least one metal species (e.g., Ti, W, Ta, Co, Mo, Ni) for inclusion in second metal nitride material 222 and at least one ligand formulated to react with the nitrogen-containing reaction to form at least a portion of the second metal nitride material 222. In some embodiments, the metal-containing reactant comprises $TiCl_4$ and the nitrogen-containing reactant comprises $NH_3$.

Referring next to FIG. 2D, a conductive structure 224 (e.g., a conductive plug) may be formed within a remaining (e.g., unfilled) portion of the opening 212 (FIG. 2C), and portions of the conductive material 216, the first metal nitride material 218, and the second metal nitride material 222 vertically extending beyond (e.g., vertically overlying) a horizontal plane of the upper surface of the third dielectric structure 210 may be removed to expose the upper surface of the third dielectric structure 210. As shown in FIG. 2D, the conductive structure 224 may be formed on portions of the second metal nitride material 222 within the opening 212 (FIG. 2C) and may horizontally extend from and between opposing side surfaces of the second metal nitride material 222 within the opening 212 (FIG. 2C). An upper surface of the conductive structure 224 may be substantially coplanar with upper surfaces of the second metal nitride material 222 and the third dielectric structure 210.

The conductive structure 224 may have a material composition substantially similar to that of the conductive structure 124 previously described with reference to FIG. 1G. In some embodiments, the conductive structure 224 is formed of and includes W. In addition, the conductive structure 224 may be formed using processes (e.g., material deposition processes, such as a non-conformal CVD process; material removal processes, such as a CMP process) substantially similar to those previously described in relation to the formation of the conductive structure 124.

The methods described with reference to FIGS. 2A through 2D facilitate the formation of an apparatus (e.g., the apparatus 200 at or after the processing stage depicted in FIG. 2D) exhibiting enhanced properties as compared to many conventional apparatuses. For example, forming the conductive material 216 and the first metal nitride material 218 on or over the metal silicide material 205 through a PVD process prior to forming the second metal nitride material 222 over the metal silicide material 205 through a CVD process may prevent the formation of a $SiN_y$ material between the second metal nitride material 222 and the metal silicide material 205 during the CVD process that may otherwise result in open-contact failures. In addition, forming the conductive material 216 and the first metal nitride material 218 on or over the metal silicide material 205 through a non-conformal process (e.g., a PVD process), such that upper portions of the side surfaces of the third dielectric structure 210 within the opening 212 (FIG. 2C) are free of the conductive material 216 and the first metal nitride material 218 thereon or thereover, may permit the conductive structure 224 to exhibit relatively larger horizontal dimensions (e.g., a relatively larger diameter). The relatively larger horizontal dimensions may increase margin for photo alignment between the conductive structure 224 and subsequently formed structures, increasing yield as compared to conventional methods of forming a comparable apparatus.

FIGS. 3A through 3D are simplified partial cross-sectional views illustrating embodiments of an additional method of forming an apparatus (e.g., a semiconductor device, such as a DRAM device). As described in further detail below, aspects (e.g., processing acts and structures) of the methods described above with reference to FIGS. 1A through 1G and FIGS. 2A through 2D may be employed in the method described below with reference to FIGS. 3A through 3D to facilitate advantages as compared to conventional methods and conventional apparatuses.

Referring to FIG. 3A, an apparatus 300 may include a base structure 302 including source/drain regions 304 therein and a channel region 306 horizontally intervening between the source/drain regions 304, and an isolation material 308 overlying portions of the base structure 302. The apparatus 300 may also include a gate structure 310 partially covered by the isolation material 308, a gate dielectric material 312 vertically intervening between the gate structure 310 and the channel region 306, and dielectric spacers 314 intervening between the gate structure 310 and the isolation material 308. In addition, first openings 316 may vertically extend through the isolation material 308 to expose upper surfaces of the source/drain regions 304, and a second opening 318 may vertically extend through the isolation material 308 and the dielectric spacers 314 to expose an upper surface of the gate structure 310. The source/drain regions 304, the channel region 306, the gate structure 310, and the gate dielectric material 312 may form a transistor 319 (e.g., a planar transistor, such as a planar field effect transistor) of the apparatus 300.

The base structure 302 may be formed of and include of semiconductive material, such as one or more of a silicon material, a silicon-germanium material, a germanium material, a gallium arsenide material, a gallium nitride material, and an indium phosphide material. By way of non-limiting example, the base structure 302 may be formed of and include at least one silicon material. As used herein, the term "silicon material" means and includes a material that includes elemental silicon or a compound of silicon. The base structure 302 may, for example, be formed of and include one or more monocrystalline silicon and polycrystalline silicon. In some embodiments, the base structure 302 comprises polycrystalline silicon.

The source/drain regions 304 of the base structure 302 may comprise conductively-doped regions of the base structure 302. By way of non-limiting example, the source/drain regions 304 may be formed of and include at least one metal silicide, such as one of more of $CoSi_x$, $WSi_x$, $TaSi_x$, $MoSi_x$, $NiSi_x$, and $TiSi_x$. In some embodiments, the source/drain regions 304 comprise $CoSi_x$ (e.g., $CoSi_2$).

The channel region 306 of the base structure 302 may be doped or may be undoped. For example, the channel region 306 may comprise a substantially undoped region of the semiconductive material of the base structure 302. In some embodiments, the channel region 306 comprises substantially undoped polycrystalline silicon.

The gate structure 310 may vertically overlie the channel region 306 of the base structure 302, and may be positioned horizontally between the source/drain regions 304 of the base structure 302. The gate structure 310 may be formed of and include at least one electrically conductive material, such as one or more of a metal, an alloy, a conductive metal oxide, a conductive metal nitride, a conductive metal silicide, and a conductively doped semiconductive material. The gate structure 310 may, for example, be formed of and include one or more of W, $WN_y$, Ni, Ta, $TaN_y$, $TaSi_x$, Pt, Cu, Ag, Au, Al, Mo, Ti, $TiN_y$, $TiSi_x$, $TiSi_xN_y$, $TiAl_xN_y$, $MoN_x$, Ir, $IrO_z$, Ru, and $RuO_z$. In some embodiments, the gate structure 310 is formed of and includes $TiN_y$.

With continued reference to FIG. 3A, the gate dielectric material 312 may vertically extend from and between a lower surface of the gate structure 310 and an upper surface of the channel region 306 of the base structure 302. The gate dielectric material 312 may be formed to exhibit any desirable height (e.g., vertical thickness) between the lower surface of the gate structure 310 and the upper surface of the channel region 306. By way of non-limiting example, a height of the gate dielectric material 312 may be less than or equal to about 150 Å, such as less than or equal to about 100 Å, less than or equal to about 75 Å, less than or equal to about 50 Å. In some embodiments, the height of the gate dielectric material 312 is less than or equal to about 100 Å.

The gate dielectric material 312 may be formed of and include at least one dielectric material, such as one or more of a low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$)), an oxide dielectric material (e.g., one or more of $SiO_x$, $AlO_x$, phosphosilicate glass, borosilicate glass, borophosphosilicate glass, fluorosilicate glass), and a nitride dielectric material (e.g., $SiN_y$)). In some embodiments, the gate dielectric material 312 comprises $SiO_x$ (e.g., $SiO_2$).

The dielectric spacers 314 may be formed on or over an upper surface of the gate dielectric material 312, and on or over side surfaces (e.g., sidewalls) and a portion of an upper surface of the gate structure 310. The dielectric spacers 314 may be formed of and at least one dielectric material, such as one or more of a dielectric oxide material (e.g., $SiO_x$; phosphosilicate glass; borosilicate glass; borophosphosilicate glass; fluorosilicate glass; $AlO_x$; a high-k oxide, such $HfO_x$, $NbO_x$, or $TiO_x$; a combination thereof), a dielectric nitride material (e.g., $SiN_y$), a dielectric oxynitride material (e.g., $SiO_xN_y$), a dielectric carbonitride material (e.g., $SiC_zN_y$), and a dielectric carboxynitride material (e.g., $SiO_xC_zN_y$), and amphorous carbon. In some embodiments, the dielectric spacers 314 are formed of and include $SiN_y$ (e.g., $Si_3N_4$).

The isolation material 308 may be formed of and include at least one dielectric material. By way of non-limiting example, the isolation material 308 may be formed of and include one or more of a dielectric oxide material (e.g., $SiO_x$; phosphosilicate glass; borosilicate glass; borophosphosilicate glass; fluorosilicate glass; $AlO_x$; a high-k oxide, such $HfO_x$, $NbO_x$, or $TiO_x$; a combination thereof), a dielectric nitride material (e.g., $Si_3N_4$), a dielectric oxynitride material (e.g., $SiO_xN_y$), a dielectric carbonitride material (e.g., $SiC_zN_y$), and a dielectric carboxynitride material (e.g., $SiO_xC_zN_y$). A material composition of the isolation material 308 may be different than that of the dielectric spacers 314. In addition, the material composition of the isolation material 308 may be substantially the same as or may be different than that of the gate dielectric material 312. In some embodiments, the isolation material 308 is formed of and includes $SiO_x$ (e.g., $SiO_2$).

With continued reference to FIG. 3A, the first openings 316 may vertically extend from and between an upper surface of the isolation material 308 and upper surfaces of the source/drain regions 304 of the base structure 302. The widths (e.g., diameters) of the first openings 316 may be less than or equal to the widths of the source/drain regions 304. As shown in FIG. 1A, in some embodiments, the widths of the first openings 316 correspond (e.g., are substantially equal to) to the widths of the source/drain regions 304.

The second opening 318 may vertically extend from and between an upper surface of the isolation material 308 and upper surfaces of the source/drain regions 304 of the base structure 302. The widths (e.g., diameters) of the first openings 316 may be less than or equal to the widths of the source/drain regions 304. As shown in FIG. 1A, in some embodiments, the widths of the first openings 316 correspond (e.g., are substantially equal to) to the widths of the source/drain regions 304.

The base structure 302 (including the source/drain regions 304 and the channel region 306 thereof), the isolation material 308, the gate structure 310, the gate dielectric material 312, the dielectric spacers 314, the first openings 316, and the second opening 318 may be formed using conventional processes (e.g., conventional deposition processes, such as one or more of in situ growth, spin-on coating, blanket coating, CVD, PECVD, ALD, and PVD; conventional material removal processes, such as conventional photolithography processes and conventional etching processes; conventional doping processes, such as one or more of conventional ion implantation processes and conventional dopant diffusion processes), which are not described in detail herein.

Referring next to FIG. 3B, a conductive material 320 may be formed on or over exposed upper surfaces of the source/drain regions 304 at lower ends of the first openings 316, on or over exposed upper surfaces of the gate structure 310 at a lower end of the second opening 318, and on or over exposed upper surfaces of the isolation material 308 outside of the first openings 316 and the second opening 318; and a first metal nitride material 322 may be formed on or over exposed upper surfaces of the conductive material 320 inside and outside of the first openings 316 and the second opening 318. As shown in FIG. 3B, the conductive material 320 and the first metal nitride material 322 may each individually partially cover and extend from and between side surfaces (e.g., sidewalls) of the isolation material 308 within the first openings 316 and the second opening 318. Upper portions of the side surfaces of the isolation material 308 within the first openings 316 and the second opening 318 may be substantially free of the conductive material 320 and the first metal nitride material 322 thereon (e.g., directly horizontally adjacent thereto) or thereover (e.g., indirectly horizontally adjacent thereto). In further embodiments, upper portions of the side surfaces of the isolation material 308 within the first openings 316 and the second opening 318 are at least partially (e.g., substantially) covered by one or more (e.g., each) of the conductive material 320 and the first metal nitride material 322.

The conductive material 320 and the first metal nitride material 322 may have substantially the same material compositions and thicknesses as the conductive material 216 and the first metal nitride material 218 previously described with reference to FIG. 2B, respectively. In addition, the conductive material 320 and the first metal nitride material 322 may be formed using processes (e.g., non-conformal deposition processes, such as PVD processes) substantially similar to those employed to form the conductive material 216 and the first metal nitride material 218, respectively.

Figure 3D:
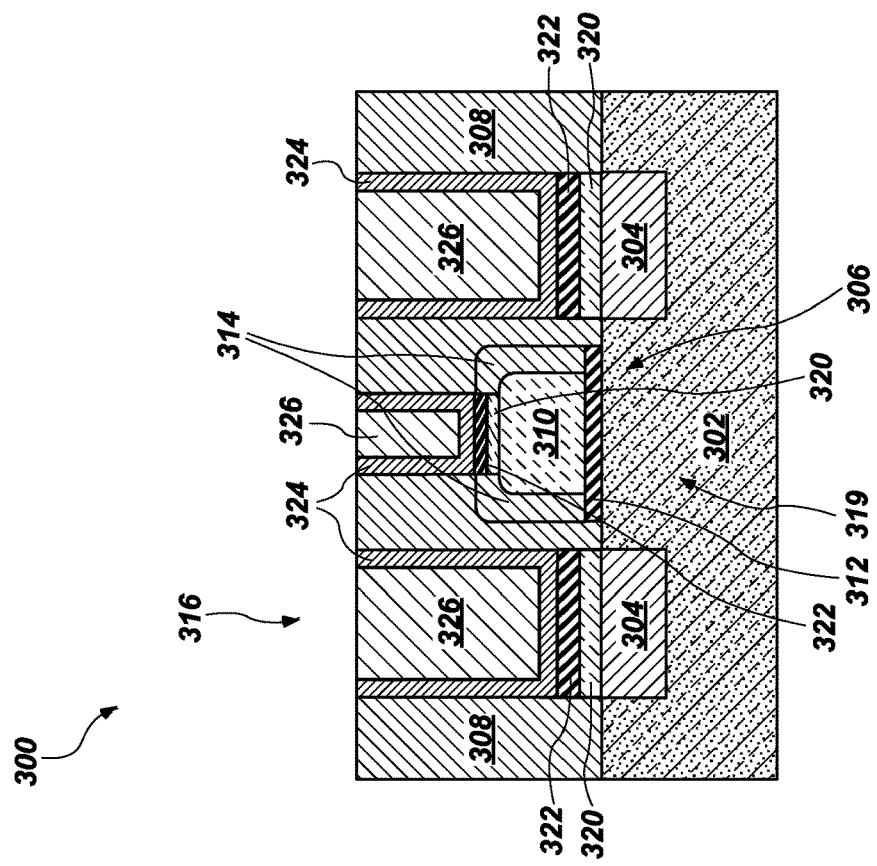
Figure 3C:
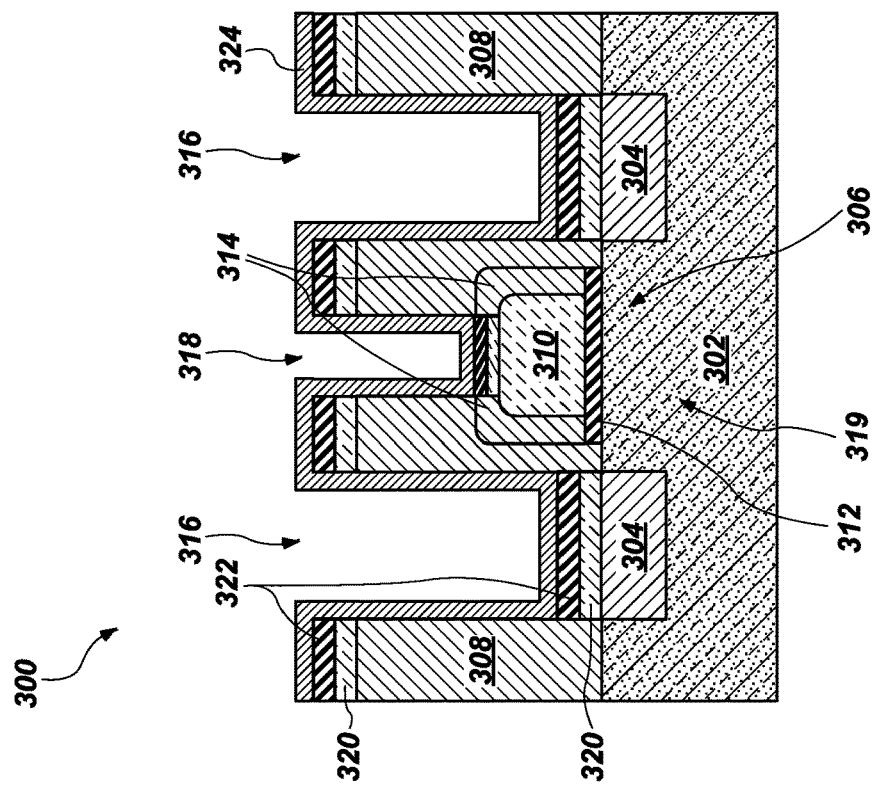

Referring next to FIG. 3C, a second metal nitride material 324 may be formed on or over surfaces inside and outside of the first openings 316 and the second opening 318. For example, as shown in FIG. 3C, the second metal nitride material 324 may be conformally formed on exposed surfaces of the first metal nitride material 322, the conductive material 320, and the isolation material 308 inside and outside of the first openings 316 and the second opening 318.

The second metal nitride material 324 may have substantially the same material compositions and thicknesses as the second metal nitride material 222 previously described with reference to FIG. 2B. In addition, the second metal nitride material 324 may be formed using a process (e.g., a conformal deposition process, such as a conformal CVD process or an ALD process) substantially similar to that employed to form the second metal nitride material 222.

Referring next to FIG. 3D, conductive structures 326 (e.g., conductive plugs) may be formed within a remaining (e.g., unfilled) portions of the first openings 316 (FIG. 3C) and the second opening 318 (FIG. 3D), and portions of the conductive material 320, the first metal nitride material 322, and the second metal nitride material 324 vertically extending beyond (e.g., vertically overlying) a horizontal plane of the upper surface of the isolation material 308 may be removed to expose the upper surface of the isolation material 308. As shown in FIG. 3D, the conductive structures 326 may be formed on portions of the second metal nitride material 324 within the first openings 316 (FIG. 3C) and second opening 318 (FIG. 3C), and may horizontally extend from and between opposing side surfaces of the second metal nitride material 324 within the first openings 316 (FIG. 3C) and the second opening 318 (FIG. 3D). Upper surfaces of the conductive structures 326 may be substantially coplanar with upper surfaces of the second metal nitride material 324 and the isolation material 308.

The conductive structures 326 may each have a material composition substantially similar to that of the conductive structure 124 previously described with reference to FIG. 1G. In some embodiments, each of the conductive structures 326 is formed of and includes W. In addition, the conductive structures 326 may be formed using processes (e.g., material deposition processes, such as a non-conformal CVD process; material removal processes, such as a CMP process) substantially similar to those previously described in relation to the formation of the conductive structure 124.

The methods described with reference to FIGS. 3A through 3D facilitate the formation of an apparatus (e.g., the apparatus 300 at or after the processing stage depicted in FIG. 3D) exhibiting enhanced properties as compared to many conventional apparatuses. For example, in addition to the benefits previously discussed with respect to the apparatus 200 at or after the processing stage depicted in FIG. 3D, the methods described with reference to FIGS. 3A through 3D may also facilitate decreased gate contact resistances and increased source-drain currents ($I_{ds}$) in the apparatus 300 as compared to conventional apparatuses formed through conventional methods.

Figure 4:
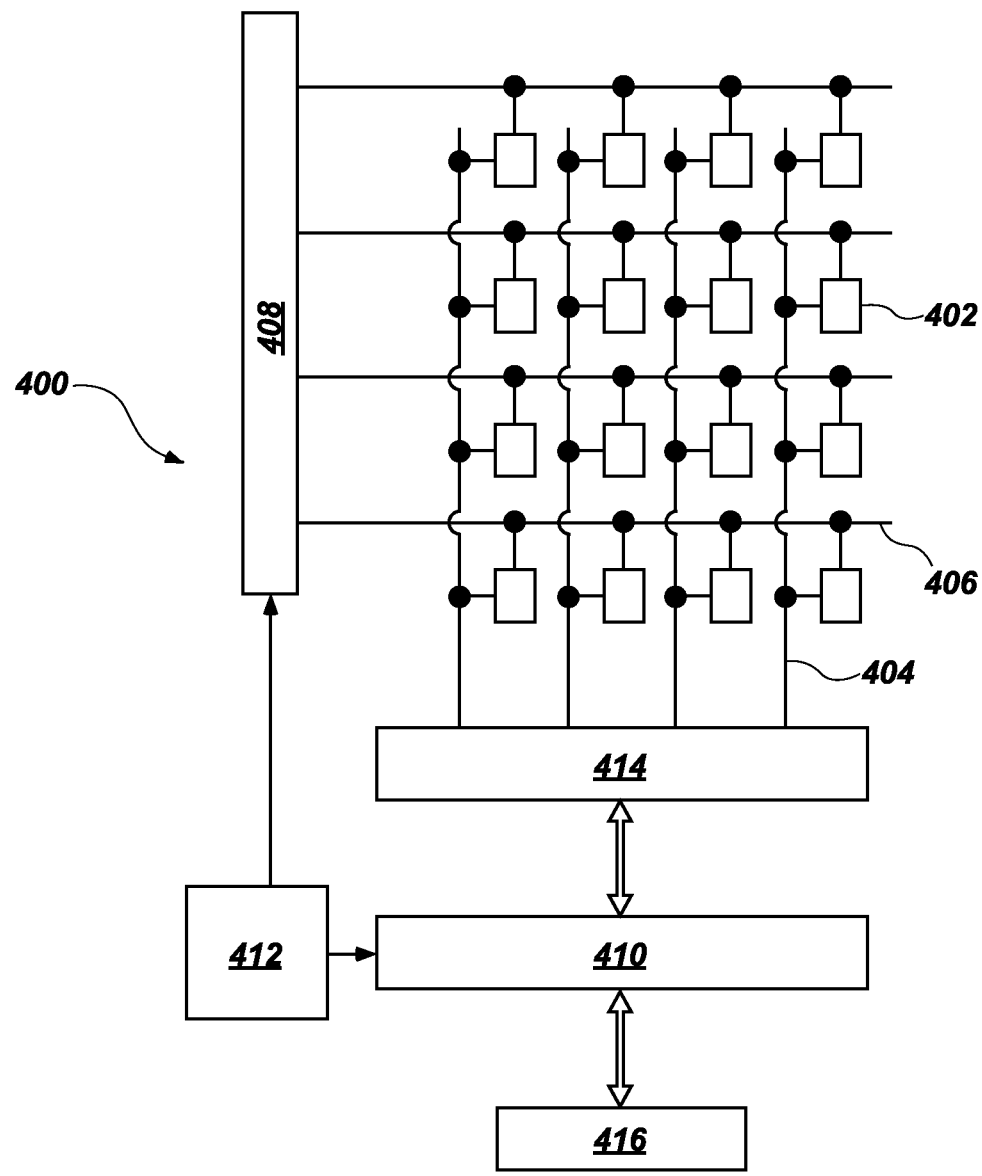
FIG. 4 is a functional block diagram of a memory device, in accordance with embodiments of the disclosure.

FIG. 4 illustrates a functional block diagram of a memory device 400 (e.g., a DRAM device), in accordance with an embodiment of the disclosure. The memory device 400 may include, for example, an embodiment of one of the apparatuses 100, 200, 300 previously described herein. As shown in FIG. 4, the memory device 400 may include memory cells 402, digit lines 404, word lines 406, a row decoder 408, a column decoder 410, a memory controller 412, a sense device 414, and an input/output device 416.

The memory cells 402 of the memory device 400 are programmable to at least two different logic states (e.g., logic 0 and logic 1). Portions of the apparatuses 100, 200, 300 previously described herein may form portions of the memory cells 402 of the memory device 400. Each memory cell 402 may individually include a storage node structure and transistor. The storage node structure stores a charge representative of the programmable logic state (e.g., a charged capacitor may represent a first logic state, such as a logic 1; and an uncharged capacitor may represent a second logic state, such as a logic 0) of the memory cell 402. The transistor grants access to the capacitor upon application of a minimum threshold voltage to a semiconductive channel thereof for operations (e.g., reading, writing, rewriting) on the storage node structure.

The digit lines 404 re connected to the storage node structures of the memory cells 402 by way of the transistors of the memory cells 402. The word lines 406 extend perpendicular to the digit lines 404, and are connected to gates of the transistors of the memory cells 402. Operations may be performed on the memory cells 402 by activating appropriate digit lines 404 and word lines 406. Activating a digit line 404 or a word line 406 may include applying a voltage potential to the digit line 404 or the word line 406. Each column of memory cells 402 may individually be connected to one of the digit lines 404, and each row of the memory cells 402 may individually be connected to one of the word lines 406. Individual memory cells 402 may be addressed and accessed through the intersections (e.g., cross points) of the digit lines 404 and the word lines 406.

The memory controller 412 may control the operations of memory cells 402 through various components, including the row decoder 408, the column decoder 410, and the sense device 414. The memory controller 412 may generate row address signals that are directed to the row decoder 408 to activate (e.g., apply a voltage potential to) predetermined word lines 406, and may generate column address signals that are directed to the column decoder 410 to activate (e.g., apply a voltage potential to) predetermined digit lines 404. The memory controller 412 may also generate and control various voltage potentials employed during the operation of the memory device 400. In general, the amplitude, shape, and/or duration of an applied voltage may be adjusted (e.g., varied), and may be different for various operations of the memory device 400.

During use and operation of the memory device 400, after being accessed, a memory cell 402 may be read (e.g., sensed) by the sense device 414. The sense device 414 may compare a signal (e.g., a voltage) of an appropriate digit line 404 to a reference signal in order to determine the logic state of the memory cell 402. If, for example, the digit line 404 has a higher voltage than the reference voltage, the sense device 414 may determine that the stored logic state of the memory cell 402 is a logic 1, and vice versa. The sense device 414 may include transistors and amplifiers to detect and amplify a difference in the signals (commonly referred to in the art as "latching"). The detected logic state of a memory cell 402 may be output through the column decoder 410 to the input/output device 416. In addition, a memory cell 402 may be set (e.g., written) by similarly activating an appropriate word line 406 and an appropriate digit line 404 of the memory device 400. By controlling the digit line 404 while the word line 406 is activated, the memory cell 402 may be set (e.g., a logic value may be stored in the memory cell 402). The column decoder 410 may accept data from the input/output device 416 to be written to the memory cells 402. Furthermore, a memory cell 402 may also be refreshed (e.g., recharged) by reading the memory cell 402. The read operation will place the contents of the memory cell 402 on the appropriate digit line 404, which is then pulled up to full level (e.g., full charge or discharge) by the sense device 414. When the word line 406 associated with the memory cell 402 is deactivated, all of memory cells 402 in the row associated with the word line 406 are restored to full charge or discharge.

Figure 5:
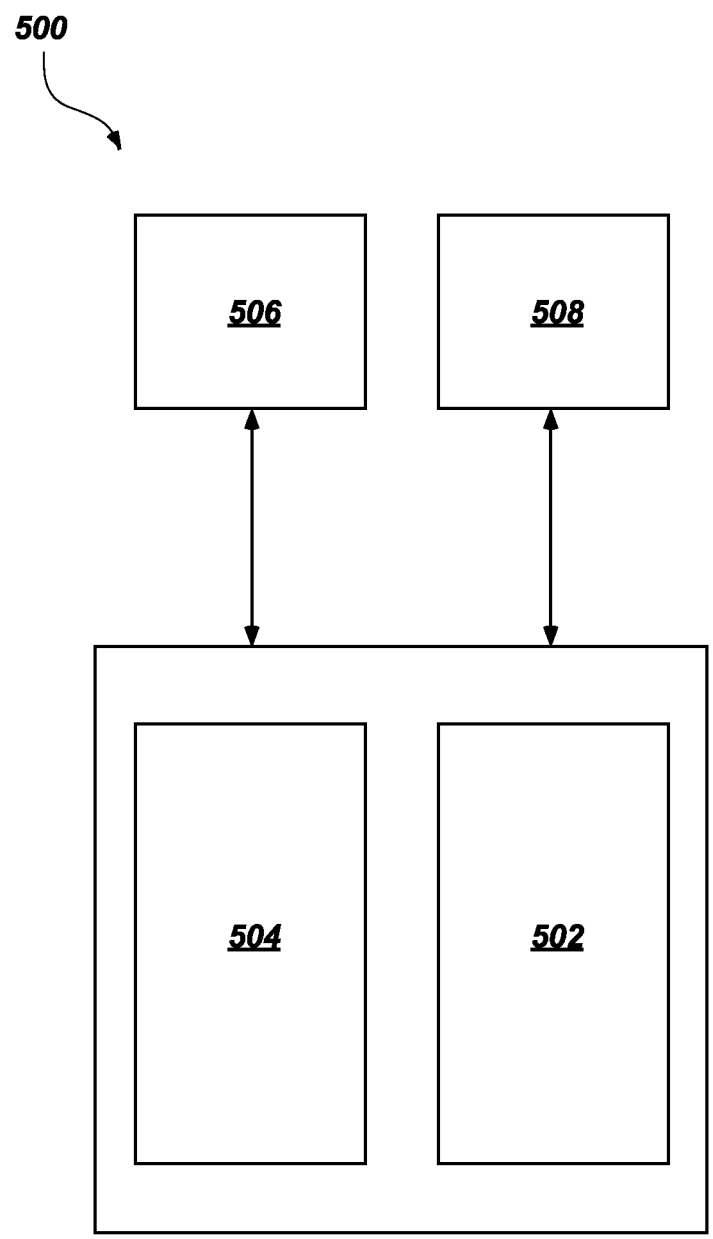
FIG. 5 is a schematic block diagram of an electronic system, in accordance with embodiments of the disclosure.

Apparatuses (e.g., the apparatuses 100, 200, 300) and semiconductor devices (e.g., the memory device 400) incorporating same in accordance with embodiments of the disclosure may be used in embodiments of electronic systems of the disclosure. For example, FIG. 5 is a block diagram of an illustrative electronic system 500 according to embodiments of disclosure. The electronic system 500 may comprise, for example, one or more of a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, and a navigation device. The electronic system 500 includes at least one memory device 502. The memory device 502 may comprise, for example, an embodiment of one or more of an apparatus (e.g., one of the apparatuses 100, 200, 300) incorporated in a semiconductor device (e.g., the memory device 400) previously described herein. The electronic system 500 may further include at least one electronic signal processor device 504 (often referred to as a "microprocessor"). The electronic signal processor device 504 may, optionally, include an embodiment of an apparatus (e.g., one of the apparatuses 100, 200, 300) incorporated in a semiconductor device (e.g., the memory device 400) previously described herein, such an arrangement often being termed a "system on a chip" (SoC). The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Thus, an electronic system according to embodiments of the disclosure comprises an input device, an output device, a processor device operably coupled to the input device and the output device, and a memory device operably coupled to the processor device. The memory device comprises a contact structure and at least one filled opening vertically overlying and aligned with the contact structure. The at least one filled opening extending through a dielectric material and comprises a conductive material, a conductive metal nitride material, an additional conductive metal nitride material, and a conductive structure. The conductive material vertically overlies an upper boundary of the contact structure, and upper regions of sidewalls of the dielectric material defining horizontal boundaries of the at least one filled opening are substantially free of the conductive material thereon. The conductive metal nitride material vertically overlies an upper boundary of the conductive material, and the upper regions of the sidewalls of the dielectric material are substantially free of the conductive metal nitride material thereon. The additional conductive metal nitride material vertically overlies an upper boundary of the conductive metal nitride material and is located on the upper regions of the sidewalls of the dielectric material. The conductive structure is on the additional conductive metal nitride material.

The methods, apparatuses, devices (e.g., memory devices, such as DRAM devices), and electronic systems of the disclosure may facilitate one or more of increased performance, increased efficiency, increased reliability, and increased durability as compared to conventional methods, conventional apparatuses, conventional apparatuses, conventional devices, and conventional electronic systems.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method of forming an apparatus, comprising:
    forming a conductive material over an upper surface of a contact structure comprising a doped semiconductive material, the conductive material comprising a metal silicon nitride material;
    forming a first metal nitride material over an upper surface of the conductive material within an opening extending through at least one dielectric material through a non-conformal deposition process;
    forming a second metal nitride material over an upper surface of the first metal nitride material and side surfaces of the at least one dielectric material partially defining boundaries of the opening through a conformal deposition process; and
    forming a conductive structure over surfaces of the second metal nitride material within the opening.

2. The method of claim 1, wherein forming the conductive material over an upper surface of a contact structure comprises:
    forming a metal silicide material over the upper surface of the contact structure within the opening through a non-conformal deposition process; and
    subjecting the metal silicide material to at least one nitridation process to form the metal silicon nitride material.

3. The method of claim 1, further comprising forming the metal silicon nitride material to have a non-uniform distribution of nitrogen and silicon throughout a vertical dimension thereof.

4. The method of claim 1, further comprising:
    forming a first portion of the metal silicon nitride material to comprise $TiSi_2N_y$, wherein y is less than one (1); and
    forming a second portion of the metal silicon nitride material to comprise TiSiN.

5. The method of claim 1, wherein forming the conductive material over an upper surface of a contact structure comprises forming the conductive material through a PVD process such that upper portions of side surfaces of the at least one dielectric material within the opening are substantially free of the conductive material thereover.

6. The method of claim 1, further comprising forming a native oxide material on surfaces of the metal silicon nitride material prior to forming the first metal nitride material over the metal silicon nitride material.

7. The method of claim 1, wherein forming a first metal nitride material over an upper surface of the conductive material comprises forming the first metal nitride material through a PVD process such that upper portions of side surfaces of the at least one dielectric material within the opening are substantially free of the first metal nitride material thereover.

8. The method of claim 1, wherein forming a second metal nitride material over an upper surface of the first metal nitride material and side surfaces of the at least one dielectric material within the opening comprises forming the second metal nitride material through a CVD process.

9. A method of forming an apparatus, comprising:
    forming a conductive material over an upper surface of a metal silicide material at a lower end of an opening extending through at least one dielectric material through a non-conformal deposition process;
    forming a first metal nitride material over an upper surface of the conductive material within the opening through a non-conformal deposition process;
    forming a second metal nitride material over an upper surface of the first metal nitride material and side surfaces of the at least one dielectric material partially defining boundaries of the opening through a conformal deposition process; and
    forming a conductive structure over surfaces of the second metal nitride material within the opening.

10. The method of claim 9, wherein forming the conductive material over an upper surface of metal silicide material comprises depositing an elemental metal on the upper surface of the metal silicide material through a PVD process.

11. The method of claim 10, wherein depositing an elemental metal on the upper surface of the metal silicide material comprises depositing elemental Ti on an upper surface of $CoSi_2$.

12. An apparatus, comprising:
    at least one contact structure; and
    at least one filled opening vertically overlying and aligned with the at least one contact structure, the at least one filled opening extending through at least one dielectric material and comprising:
        a conductive material vertically overlying an upper surface of the at least one contact structure, upper portions of side surfaces of the at least one dielectric material substantially free of the conductive material horizontally thereover;
        a first metal nitride material vertically overlying an upper surface of the conductive material, the upper portions of the side surfaces of the at least one dielectric material substantially free of the first metal nitride material horizontally thereover;
        a second metal nitride material vertically overlying an upper surface of the first metal nitride material and horizontally overlying the upper portions of the side surfaces of the at least one dielectric material; and
        a conductive structure overlying surfaces of the second metal nitride material.

13. The apparatus of claim 12, wherein:
    the at least one contact structure comprises a conductively-doped semiconductive material; and
    the conductive material of the at least one filled opening comprises a metal silicon nitride material on the upper surface of the at least one contact structure.

14. The apparatus of claim 13, wherein atomic concentrations of nitrogen and silicon vary throughout a vertical thickness of the metal silicon nitride material.

15. The apparatus of claim 13, wherein a first region of the metal silicon nitride material exhibits a higher atomic concentration of nitrogen and a lower atomic concentration of silicon than a second region of the metal silicon nitride material vertically thereover.

16. The apparatus of claim 12, further comprising an oxide material vertically intervening between the first metal nitride material and the second metal nitride material.

17. The apparatus of claim 12, wherein:
the at least one contact structure comprises a metal silicide material; and
the conductive material is located on the upper surface of the at least one contact structure.

18. The apparatus of claim 12, wherein the at least one contact structure comprises $CoSi_2$ and the conductive material comprises one or more of elemental Ti and $TiSi_2$.

19. The apparatus of claim 12, wherein:
the at least one contact structure comprises two metal silicide structures horizontally separated from one another within a semiconductive material; and
the at least one filled opening comprises two filled openings, a first of the filled openings vertically overlying and aligned with a first of the two metal silicide structures, and a second of the filled openings vertically overlying and aligned with a second of the two metal silicide structures.

20. The apparatus of claim 19, further comprising:
a gate structure vertically overlying the semiconductive material and positioned horizontally between the two metal silicide structures; and
a gate dielectric material vertically intervening between the gate structure and the semiconductive material.

21. The apparatus of claim 20, further comprising an additional filled opening vertically overlying and aligned with the gate structure, the additional filled opening extending through the at least one dielectric material and comprising:
an additional conductive material vertically overlying an upper surface of the gate structure, upper portions of additional side surfaces of the at least one dielectric material substantially free of the additional conductive material horizontally thereover;
an additional first metal nitride material vertically overlying an upper surface of the additional conductive material, the upper portions of the additional side surfaces of the at least one dielectric material substantially free of the additional first metal nitride material horizontally thereover;
an additional second metal nitride material vertically overlying an upper surface of the additional first metal nitride material and horizontally overlying the upper portions of the additional side surfaces of the at least one dielectric material; and
an additional conductive structure overlying surfaces of the additional second metal nitride material.

22. An electronic system, comprising:
an input device;
an output device;
a processor device operably coupled to the input device and the output device; and
a memory device operably coupled to the processor device and comprising:
a contact structure; and
at least one filled opening vertically overlying and aligned with the contact structure, the at least one filled opening extending through a dielectric material and comprising:
a conductive material vertically overlying an upper boundary of the contact structure, upper regions of sidewalls of the dielectric material defining horizontal boundaries of the at least one filled opening substantially free of the conductive material thereon;
a conductive metal nitride material vertically overlying an upper boundary of the conductive material, the upper regions of the sidewalls of the dielectric material substantially free of the conductive metal nitride material thereon;
an additional conductive metal nitride material vertically overlying an upper boundary of the conductive metal nitride material and located on the upper regions of the sidewalls of the dielectric material; and
a conductive structure on the additional conductive metal nitride material.

23. The electronic system of claim 22, wherein uppermost surfaces of the additional conductive metal nitride material, the conductive structure, and the dielectric material are substantially coplanar with one another and are vertically offset from uppermost surfaces of the conductive material and the conductive metal nitride material.

* * * * *

UNITED STATES PATENT AND TRADEMARK OFFICE
CERTIFICATE OF CORRECTION

PATENT NO. : 10,707,212 B1
APPLICATION NO. : 16/235957
DATED : July 7, 2020
INVENTOR(S) : Kentaro Ishii et al.

Page 1 of 1

It is certified that error appears in the above-identified patent and that said Letters Patent is hereby corrected as shown below:

In the Specification

Column 14, Line 22, change "current ($T_{off}$) as" to --current ($I_{off}$) as--

Signed and Sealed this
Tenth Day of November, 2020

Andrei Iancu
*Director of the United States Patent and Trademark Office*